United States Patent
Kiuchi

(10) Patent No.: US 8,040,490 B2
(45) Date of Patent: Oct. 18, 2011

(54) LIQUID IMMERSION EXPOSURE APPARATUS, EXPOSURE METHOD, AND METHOD FOR PRODUCING DEVICE

(75) Inventor: Tohru Kiuchi, Higashi-Kurume (JP)

(73) Assignee: Nikon Corporation, Tokyo (JP)

( * ) Notice: Subject to any disclaimer, the term of this patent is extended or adjusted under 35 U.S.C. 154(b) by 808 days.

(21) Appl. No.: 11/987,372

(22) Filed: Nov. 29, 2007

(65) Prior Publication Data
US 2008/0137045 A1    Jun. 12, 2008

Related U.S. Application Data

(60) Provisional application No. 60/881,852, filed on Jan. 23, 2007.

(30) Foreign Application Priority Data

Dec. 1, 2006   (JP) .................................. 2006-325776

(51) Int. Cl.
G03B 27/32    (2006.01)
G03B 27/52    (2006.01)
G03B 27/58    (2006.01)

(52) U.S. Cl. ................. 355/30; 355/27; 355/53; 355/72
(58) Field of Classification Search ................... 355/27, 355/30, 53, 72
See application file for complete search history.

(56) References Cited

U.S. PATENT DOCUMENTS

| | | |
|---|---|---|
| 4,346,164 A | 8/1982 | Tabarelli et al. |
| 4,480,910 A | 11/1984 | Takanashi et al. |
| 5,610,683 A | 3/1997 | Takahashi |
| 5,715,039 A | 2/1998 | Fukuda et al. |
| 5,825,043 A | 10/1998 | Suwa |
| 7,110,081 B2 | 9/2006 | Hoogendam et al. |
| 7,224,436 B2 | 5/2007 | Derksen et al. |
| 2004/0165159 A1 | 8/2004 | Lof et al. |

(Continued)

FOREIGN PATENT DOCUMENTS

DE      221563 A1    4/1985

(Continued)

OTHER PUBLICATIONS

International Search Report issued in International Patent Application No. PCT/JP2007/073250 dated Mar. 4, 2008 with English Translation.

(Continued)

*Primary Examiner* — Hung Henry Nguyen
*Assistant Examiner* — Colin Kreutzer
(74) *Attorney, Agent, or Firm* — Oliff & Berridge, PLC

(57) ABSTRACT

A liquid immersion exposure apparatus includes: a first optical member having an exit surface via which an exposure beam exits; a first movable body movable with respect to the first optical member while holding a substrate; a cover member movable with movement of the first movable body and capable of retaining a liquid in a space formed between the exit surface and the cover member when the cover member is arranged at a position opposite to the exit surface; a first holding portion provided on the first movable body and holding the cover member; and a transport section removing the cover member from the first holding portion and moving the cover member independently from the first movable body. Upon exposing the substrate through the liquid, it is possible to suppress the deterioration of the performance which would be otherwise caused due to the cover member.

13 Claims, 21 Drawing Sheets

U.S. PATENT DOCUMENTS

| | | | |
|---|---|---|---|
| 2005/0219489 A1* | 10/2005 | Nei et al. | 355/53 |
| 2006/0103818 A1* | 5/2006 | Holmes et al. | 355/53 |
| 2006/0103820 A1 | 5/2006 | Donders et al. | |
| 2006/0126037 A1 | 6/2006 | Jansen et al. | |
| 2006/0132731 A1* | 6/2006 | Jansen et al. | 355/30 |
| 2006/0250588 A1* | 11/2006 | Brandl | 355/30 |
| 2007/0177125 A1 | 8/2007 | Shibazaki | |
| 2007/0285639 A1* | 12/2007 | Liang et al. | 355/53 |
| 2008/0018867 A1* | 1/2008 | Fujiwara et al. | 355/30 |
| 2009/0002658 A1* | 1/2009 | Kiuchi | 355/53 |

FOREIGN PATENT DOCUMENTS

| | | |
|---|---|---|
| DE | 224448 A1 | 7/1985 |
| JP | A-58-202448 | 11/1983 |
| JP | A-59-19912 | 2/1984 |
| JP | A-62-065326 | 3/1987 |
| JP | A-63-157419 | 6/1988 |
| JP | A-4-305915 | 10/1992 |
| JP | A-4-305917 | 10/1992 |
| JP | A-5-062877 | 3/1993 |
| JP | A-6-124873 | 5/1994 |
| JP | A-7-220990 | 8/1995 |
| JP | A-8-316125 | 11/1996 |
| JP | A-10-303114 | 11/1998 |
| JP | A-10-340846 | 12/1998 |
| JP | A-11-176727 | 7/1999 |
| JP | A-2000-058436 | 2/2000 |
| JP | A-2004-289128 | 10/2004 |
| JP | A-2006-140498 | 6/2006 |
| JP | A-2006-147776 | 6/2006 |
| JP | A-2006-173620 | 6/2006 |
| WO | WO 99/49504 | 9/1999 |
| WO | WO 2004/019128 | 3/2004 |
| WO | WO 2005/122219 A1 | 12/2005 |
| WO | WO 2006062065 A1 * | 6/2006 |
| WO | WO 2007/029829 | 3/2007 |

OTHER PUBLICATIONS

Written Opinion issued in International Patent Application No. PCT/JP2007/073250 dated Mar. 4, 2008 with English Translation.

* cited by examiner

LIQUID IMMERSION EXPOSURE APPARATUS, EXPOSURE METHOD, AND METHOD FOR PRODUCING DEVICE

CROSS-REFERENCES TO RELATED APPLICATIONS

This application claims the benefit of priority of Japanese Patent Application No. 2006-325776 filed on Dec. 1, 2006 and U.S. Provisional Application No. 60/881,852 filed on Jan. 23, 2007, the entire disclosures of which are incorporated herein by reference.

BACKGROUND OF THE INVENTION

1. Field of the Invention

The present invention relates to a liquid immersion exposure apparatus, an exposure method, and a method for producing a device, wherein a substrate is exposed through a liquid.

2. Description of the Related Art

A liquid immersion exposure apparatus, in which a substrate is exposed through or via a liquid, has been contrived as disclosed in Japanese Patent Application Laid-open No. 2004-289128 in relation to an exposure apparatus to be used for the photolithography step.

In the conventional technique, a shutter member is arranged at a position opposite to or facing a light exit surface (light outgoing surface) of the projection optical system to form a space holding or retaining the liquid between the shutter member and the light exit surface of the projection optical system. There is a possibility that the shutter member is deteriorated and/or polluted. If the shutter member is continuously used while leaving the state that the shutter member is deteriorated and/or polluted as it is, the following possibility arises such that, for example, the liquid, which is retained between the shutter member and the light exit surface of the projection optical system, leaks, and/or that the light exit surface of the projection optical system is polluted (for example, any water mark appears, etc.). If such an inconvenience or problem arises, for example, there is a possibility that the exposure accuracy is deteriorated. Further, if it is necessary that the maintenance operation is performed frequently due to, for example, the leakage of the liquid and/or the pollution of the projection optical system, then there is a possibility that the working rate of the exposure apparatus is lowered.

The present invention has been made taking the foregoing circumstances into consideration, an object of which is to provide a liquid immersion exposure apparatus which makes it possible to suppress the deterioration of the performance which would be otherwise caused by any member holding or retaining the liquid between the member and an optical member (for example, a terminal (final) optical element of a projection optical system, etc.) when a substrate is exposed through a liquid, and a method for producing a device by using the liquid immersion exposure apparatus. Another object of the present invention is to provide an exposure method which makes it possible to suppress the deterioration of the performance of the liquid immersion exposure apparatus which would be otherwise caused by such a member when a substrate is exposed through a liquid, and a method for producing a device by using the exposure method.

SUMMARY OF THE INVENTION

In order to achieve the objects as described above, the present invention adopts the following constructions corresponding to respective drawings as illustrated in embodiments. However, parenthesized reference numerals affixed to respective elements merely exemplify the elements by way of example, with which it is not intended to limit the respective elements.

According to a first aspect of the present invention, there is provided a liquid immersion exposure apparatus which exposes a substrate by radiating an exposure beam onto the substrate, the liquid immersion exposure apparatus comprising: a first optical member having an exit surface via which the exposure beam exits; a first movable body which is movable with respect to the first optical member while holding the substrate; a cover member which is movable in accordance with movement of the first movable body and which is capable of retaining a liquid in a space formed between the exit surface and the cover member when the cover member is located at a position opposite to the exit surface; a first holding portion which is provided on the first movable body and which holds the cover member; and a transport section which removes the cover member from the first holding portion and which moves the cover member independently from the first movable body.

According to the first aspect of the present invention, there is provided the transport section which removes the cover member from the first holding portion of the first movable body and which moves the cover member independently from the first movable body. Therefore, an appropriate process can be performed for the cover member in order to suppress the deterioration of the performance of the exposure apparatus.

According to a second aspect of the present invention, there is provided a method for producing a device, comprising exposing a substrate by using the liquid immersion exposure apparatus as defined in the first aspect; developing the exposed substrate; and processing the developed substrate.

According to the second aspect of the present invention, the device can be produced by using the liquid immersion exposure apparatus in which the deterioration of the performance is suppressed.

According to a third aspect of the present invention, there is provided a liquid immersion exposure apparatus which exposes a substrate by radiating an exposure beam onto the substrate, the liquid immersion exposure apparatus comprising: a first optical member having an exit surface via which the exposure beam exits; a first movable body which is movable with respect to the first optical member while holding the substrate; a second movable body which is movable, while holding the substrate, with respect to the first optical member independently from the first movable body; a cover member which is movable in accordance with movement of the first movable body or movement of the second movable body and which is capable of retaining a liquid in a space formed between the exit surface and the cover member when the cover member is located at a position opposite to the exit surface; a first holding portion which is provided on the first movable body and which holds the cover member during exposure for a substrate held by the first movable body; a second holding portion which is provided on the second movable body and which holds the cover member during exposure for a substrate held by the second movable body; and a transport section which removes the cover member from the first holding portion or the second holding portion and which moves the cover member independently from the first movable body or the second movable body.

According to the third aspect of the present invention, the transport section is provided in order that the cover member is removed from the first holding portion of the first movable body or the second holding portion of the second movable body, and that the cover member is moved independently from the first movable body or the second movable body. Therefore, an appropriate process can be performed for the cover member in order to suppress the deterioration of the performance of the exposure apparatus.

According to a fourth aspect of the present invention, there is provided a method for producing a device, comprising exposing a substrate by using the liquid immersion exposure apparatus as defined in the third aspect; developing the exposed substrate; and processing the developed substrate.

According to the fourth aspect of the present invention, the device can be produced by using the liquid immersion exposure apparatus in which the deterioration of the performance is suppressed.

According to a fifth aspect of the present invention, there is provided a liquid immersion exposure apparatus which exposes a substrate via an optical member and a liquid, the liquid immersion exposure apparatus comprising: a first movable body movable in a predetermined area including a first area which includes a position opposite to the optical member and a second area different from the first area; a second movable body which is movable independently from the first movable body in the predetermined area; a cover member which is held by a holding section arranged in the vicinity of the optical member when both of the first movable body and the second movable body are away from the first area and which is capable of retaining the liquid in a space between the optical member and the cover member; a first holding portion which is provided on the first movable body and which releasably holds the cover member during exposure for a substrate held by the first movable body; a second holding portion which is provided on the second movable body and which releasably holds the cover member during exposure for a substrate held by the second movable body; and a transport section which transports the cover member to a predetermined position different from the holding section, the first holding portion, and the second holding portion.

According to the fifth aspect of the present invention, the transport section is provided which transports the cover member to the predetermined position different from the holding section, the first holding portion, and the second holding portion. Therefore, an appropriate process can be performed for the cover member in order to suppress the deterioration of the performance of the exposure apparatus.

According to a sixth aspect of the present invention, there is provided a method for producing a device, comprising exposing a substrate by using the liquid immersion exposure apparatus as defined in the fifth aspect; developing the exposed substrate; and processing the developed substrate.

According to the sixth aspect of the present invention, the device can be produced by using the liquid immersion exposure apparatus in which the deterioration of the performance is suppressed.

According to a seventh aspect of the present invention, there is provided an exposure method for exposing a substrate via an optical member and a liquid, the exposure method comprising: moving a movable body so that a surface, of a cover member, different from a liquid-contact surface of the cover member which makes contact with the liquid faces a first holding portion provided on the movable body, while retaining the liquid in a space between the optical member and the cover member held by a holding section; releasing the cover member from the holding section and transferring the cover member to the first holding portion; moving the liquid relative to a space between the optical member and the substrate in accordance with movement of the movable body; exposing the substrate via the liquid and the optical member in a first area which includes a position opposite to the optical member; moving the movable body, holding the cover member and the substrate, to a second area different from the first area; and releasing the cover member held by the movable body moved to the second area and transporting the cover member to a position different from the holding section and the first holding portion.

According to the seventh aspect of the present invention, the cover member is transported to the position different from or other than the holding section and the first holding portion. Therefore, an appropriate process can be performed for the cover member in order to suppress the deterioration of the performance of the exposure apparatus.

According to an eighth aspect of the present invention, there is provided a method for producing a device, comprising exposing a substrate by using the exposure method as defined in the seventh aspect; developing the exposed substrate; and processing the developed substrate.

According to the eighth aspect of the present invention, the device can be produced by using the exposure method in which the deterioration of the performance of the exposure apparatus is suppressed.

According to a ninth aspect of the present invention, there is provided an exposure method for exposing a substrate with an exposure beam via an optical member, the method comprising: exposing the substrate, which is arranged movably in a predetermined area, with the exposure beam via the optical member and a liquid while retaining the liquid in a space between the optical member and the substrate; moving the liquid from the space between the optical member and the substrate to a space between the optical member and a cover member, without releasing the liquid from the optical member; and transporting the cover member from the predetermined area to clean or exchange the cover member.

According to the ninth aspect of the present invention, the cover member is washed or exchanged. Therefore, it is possible to suppress the deterioration of the performance of the exposure apparatus which would be otherwise caused by any dirt of the cover member or dirtied cover member, etc.

According to a tenth aspect of the present invention, there is provided a method for producing a device, comprising exposing a substrate by using the exposure method as defined in the ninth aspect; developing the exposed substrate; and processing the developed substrate. According to the tenth aspect of the present invention, the high performance device can be produced at a high throughput.

According to the present invention, it is possible to suppress the deterioration of the performance of the exposure apparatus. Therefore, the device having the desired performance can be produced at a high productivity.

DESCRIPTION OF THE PREFERRED EMBODIMENTS

Although embodiments of the present invention will be explained below with reference to the drawings, the present invention is not limited thereto. In the following description, a XYZ rectangular coordinates system is defined, and the positional relationship between respective members is explained with reference to the XYZ rectangular coordinates system. An X axis direction is a predetermined direction in a horizontal plane, a Y axis direction is a direction which is perpendicular to the X axis direction in the horizontal plane, and a Z axis direction is a direction which is perpendicular to the X axis direction and the Y axis direction (i.e., vertical direction). The directions of rotation (inclination) about the X axis, the Y axis, and the Z axis are designated as θX, θY, and θZ directions respectively.

First Embodiment

Figure 1:
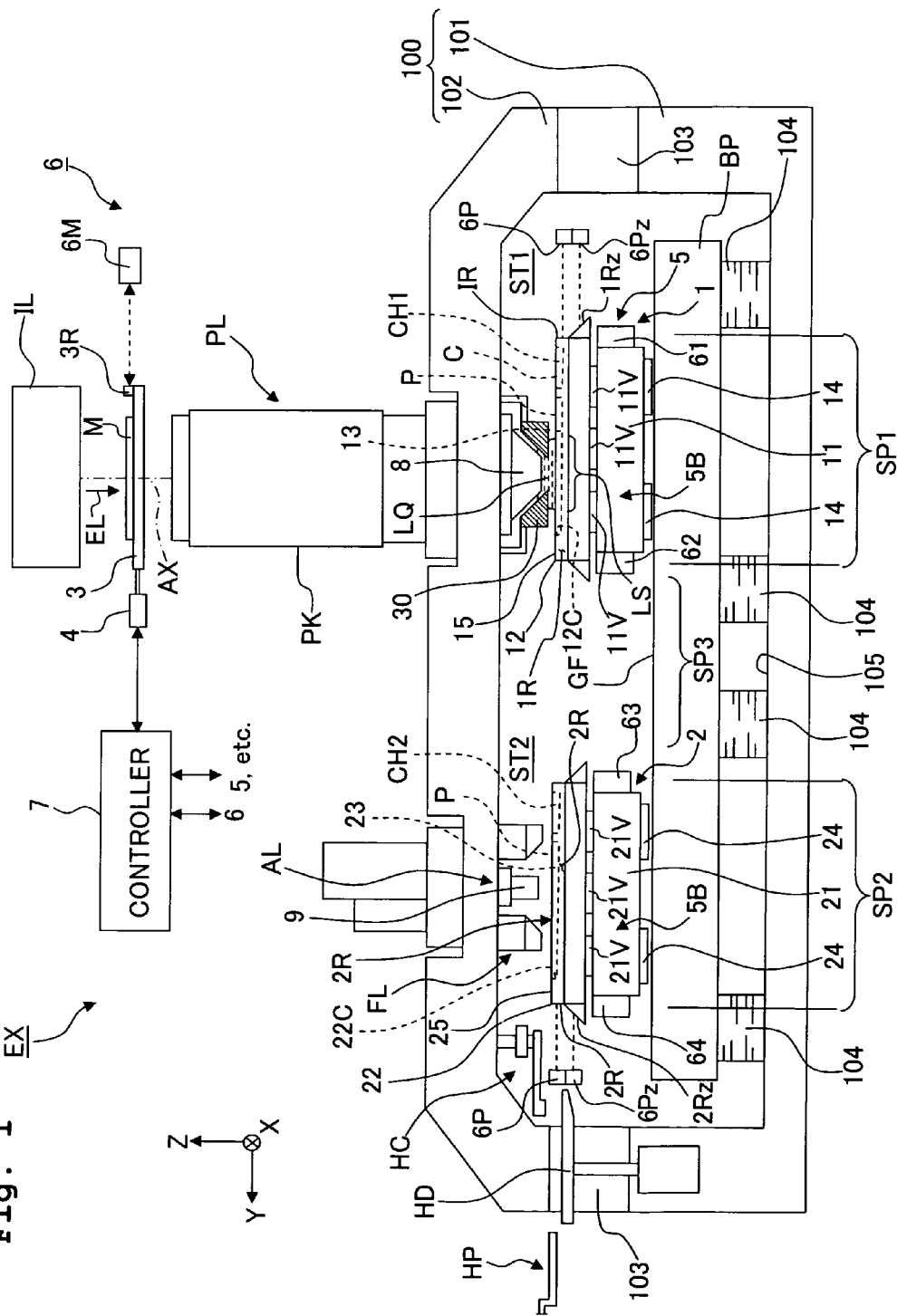
FIG. 1 shows a schematic arrangement view of an exposure apparatus according to a first embodiment.

A first embodiment will be explained. FIG. 1 is a schematic arrangement view of an exposure apparatus EX according to this embodiment. In this embodiment, an explanation will be made as exemplified by a case in which the exposure apparatus EX is an exposure apparatus of the multi-stage (twin-stage) type provided with a plurality of (two) substrate stages 1, 2 which are movable while holding substrates P, as disclosed, for example, in Japanese Patent Application Laid-open No. 10-163099, Japanese Patent Application Laid-open No. 10-214783 (corresponding to U.S. Pat. No. 6,590,634), Published Japanese Translation of PCT International Publication for Patent Application No. 2000-505958 (corresponding to U.S. Pat. No. 5,969,441), Published Japanese Translation of PCT International Publication for Patent Application No. 2000-511704 (corresponding to U.S. Pat. No. 5,815,246), Japanese Patent Application Laid-open No. 2000-323404 (corresponding to U.S. Pat. No. 6,674,510), Japanese Patent Application Laid-open No. 2000-505958 (corresponding to U.S. Pat. No. 5,969,081), Published Japanese Translation of PCT International Publication for Patent Application No. 2001-513267 (corresponding to U.S. Pat. No. 6,208,407), and Japanese Patent Application Laid-open No. 2002-158168 (corresponding to U.S. Pat. No. 6,710,849). That is, in this embodiment, the exposure apparatus EX has the first substrate stage 1 which is movable while holding the substrate P, and the second substrate stage 2 which is movable while holding the substrate P independently from the first substrate stage 1. The exposure apparatus of the multi-stage (twin-stage) type is also disclosed in U.S. Pat. Nos. 6,341,007, 6,400,441, 6,549,269, and 6,590,634 in addition to the above-identified United States patents. Contents of these United States patents are incorporated herein by reference.

With reference to FIG. 1, the exposure apparatus EX includes a mask stage 3 which is movable while holding a mask M, the first substrate stage 1 which is movable while holding the substrate P, the second substrate stage 2 which is movable while holding the substrate P independently from the first substrate stage 1, a mask stage-driving system 4 which moves the mask stage 3, a substrate stage-driving system 5 which moves the first substrate stage 1 and the second substrate stage 2, a measuring system 6 including laser interferometers each of which measures the position information about one of the stages 1, 2, 3, an illumination system IL which illuminates the mask M with an exposure beam (exposure light) EL, a projection optical system PL which projects, onto the substrate P, an image of a pattern of the mask M illuminated with the exposure light EL, and a controller 7 which controls the operation of the entire exposure apparatus EX.

The substrate P referred to herein is, for example, a substrate such as a silicon wafer for producing the device, and includes substrates obtained by forming various types of films such as a photosensitive material (photoresist) and a protective film (top coat film) on a base material such as a semiconductor wafer. The mask M includes a reticle formed with a device pattern to be projected onto the substrate P, for example, a reticle having a predetermined pattern formed therein by using a light-shielding film such as chromium or the like on a transparent plate member such as a glass plate. In this embodiment, a transmissive type mask is used as the mask. However, it is also possible to use a reflective type mask. The transmissive type mask is not limited to a binary mask on which a pattern is formed with a light-shielding film, and also includes, for example, a phase shift mask based on, for example, the spatial frequency modulation type or a half tone type.

The exposure apparatus EX of this embodiment is provided with an exposure station ST1 which exposes the substrate P, and a measuring station ST2 which performs a predetermined measurement in relation to the exposure for the substrate P and the exchange of the substrate P. The first substrate stage 1 and the second substrate stage 2 are movable between the exposure station ST1 and the measuring station ST2 while holding the substrates respectively. The exposure apparatus EX is provided with a base member BP which has a guide surface GF arranged to range over the exposure station ST1 and the measuring station ST2. Each of the first substrate stage 1 and the second substrate stage 2 is movable between the exposure station ST1 and the measuring station ST2 along the guide surface GF. In this embodiment, the guide surface GF, of the base member BP, which movably supports the first substrate stage 1 and the second substrate stage 2 respectively is substantially parallel to the XY plane.

The illumination system IL, the mask stage 3, and the projection optical system PL and the like are arranged in the exposure station ST1. The projection optical system PL has a plurality of optical elements. These optical elements include a terminal end optical element 8. The terminal end optical element 8 is closest to the image plane of the projection optical system PL among the optical elements and has a light exit surface (lower surface) via which the exposure light EL exits. The first substrate stage 1 is movable on the light-exit side (image plane side of the projection optical system PL) of the terminal end optical element 8 of the projection optical system PL which radiates the exposure light EL. The second substrate stage 2 is movable independently from the first substrate stage 1 on the light-exit side (image plane side of the projection optical system PL) of the terminal end optical element 8 of the projection optical system PL. Although not shown, the projection optical system PL is provided on a surface plate of a barrel (barrel surface plate) supported by three support columns via an anti-vibration mechanism. However, the projection optical system PL may be supported by hanging the projection optical system PL with respect to an unillustrated main frame member arranged over or above the projection optical system PL, an unillustrated mask base supporting the mask stage 3, or the like as disclosed, for example, in International Publication No. 2006/038952.

Those arranged in the measuring station ST2 include various types of measuring devices capable of executing the measurement in relation to the exposure for the substrate P, the measuring devices including an alignment system AL which obtains the position information about the substrate P, a focus/leveling-detecting system FL, and the like. The alignment system AL has a plurality of optical elements. The alignment system AL uses the optical elements to obtain the position information about the substrate P. The focus/leveling-detecting system FL also has a plurality of optical elements. The focus/leveling-detecting system FL uses the optical elements to obtain the position information about the substrate P.

In the vicinity of the measuring station ST2, there is provided a substrate transport system HP which exchanges the substrate P. The controller 7 uses the substrate transport system HP to thereby make it possible to execute a substrate exchange operation for unloading (transporting) a substrate P, for which the exposure process has been performed, from the first substrate stage 1 (or the second substrate stage 2) moved to a substrate exchange position (loading position) of the measuring station ST2, and for loading (transporting) another substrate P, which is to be subjected to the exposure process, on the first substrate stage 1 (or the second substrate stage 2). In this embodiment, the loading position and the unloading position are at a same position in the measuring station ST2. However, the load and the unload may be performed at different positions.

The exposure apparatus EX of the embodiment is a liquid immersion exposure apparatus to which the liquid immersion method is applied in order that the exposure wavelength is substantially shortened to improve the resolution and the depth of focus is substantially widened. The exposure apparatus EX is provided with a seal member (nozzle member) 30 which is capable of forming a liquid immersion space LS of a liquid LQ so that the optical path space for the exposure light EL is filled with the liquid LQ. In this embodiment, the seal member 30 constructs at least a part of a liquid immersion mechanism which is provided on the exposure apparatus EX. The optical path space for the exposure light EL is a space which includes the optical path along which the exposure light EL is advanced or allowed to travel. The liquid immersion space LS is a space which is filled with the liquid LQ. The exposure apparatus EX radiates the exposure light EL onto the substrate P via the projection optical system PL and the liquid LQ to expose the substrate P. In this embodiment, water (pure or purified water) is used as the liquid LQ. Those transmissive through pure water include not only the ArF excimer laser light beam but also, for example, the emission line radiated, for example, from a mercury lamp and the far ultraviolet light beam (DUV light beam) such as the KrF excimer laser beam. In this embodiment, the optical element 8 is formed of calcium fluoride ($CaF_2$). The calcium fluoride has a high affinity for water. Therefore, the liquid LQ is successfully allowed to make tight contact substantially with an entire surface of a liquid contact surface (light exit surface, light outgoing surface) of the optical element 8. The optical element 8 may be silica glass which has a high affinity for water.

The seal member 30 includes a seal member disclosed, for example, in Japanese Patent Application Laid-open No. 2004-289126 (corresponding to U.S. Pat. No. 6,952,253) and Japanese Patent Application Laid-open No. 2004-289128 (corresponding to U.S. Pat. No. 7,110,081). The seal member 30 is also referred to as "liquid immersion space-forming member", "containment member" (or "confinement member"), or the like. The seal member 30 is capable of forming the liquid immersion space LS between the seal member 30 and an object opposite to or facing the seal member 30. In this embodiment, the seal member 30 is arranged in the vicinity of the terminal end optical element 8 of the projection optical system PL. The seal member 30 is capable of forming the liquid immersion space LS between the seal member 30 and an object arranged at a position at which the exposure light EL can be irradiated, namely the object arranged at the position opposite to or facing the light exit surface of the terminal end optical element 8, on the light-exit side of the terminal end optical element 8 (on the image plane side of the projection optical system PL). The seal member 30 holds or retains the liquid LQ between the seal member 30 and the object to thereby form the liquid immersion space LS of the liquid LQ so that the optical path space for the exposure light EL on the light-exit side of the terminal end optical element 8, specifically an optical path space for the exposure light EL between the terminal end optical element 8 and the object is filled with the liquid LQ. As for the seal member 30, it is also possible to use a nozzle member or a seal member having the structure as disclosed, for example, in United State Patent Application Publication No. US 2005/0280791, International Publication No. 2005/024517, European Patent Application Publication No. 1420298, International Publication No. 2004/055803, International Publication No. 2004/057589, International Publication No. 2004/057590, United States Patent Application Publication No. 2006/0231206, and U.S. Pat. No. 6,952,253. Namely, as an example, it is allowable that the seal member 30 is not provided with a member which forms a gas seal 82, which will be explained later on, for confining (retaining) the liquid LQ; the seal member 30 may be a nozzle member capable of by employing surface tension to form a liquid immersion space LS of the liquid LQ. Further, in this embodiment, the seal member 30 is provided on a support frame 102 which will be explained later and which supports the projection optical system PL. However, when the projection optical system PL is suspended and supported, then the seal member 30 may be suspended and supported integrally with the projection optical system PL, or the seal member 30 may be provided on a measurement frame or the like which is suspended and supported independently from the projection optical system PL. In the latter case, it is allowable that the projection optical system PL is not suspended and supported.

The object, which can be opposite to the seal member 30 and the terminal end optical element 8, includes an object which is movable on the light-exit side of the terminal end optical element 8. In this embodiment, the object, which can be opposite to the seal member 30 and the terminal end optical element 8, includes at least one of the first substrate stage 1 and the second substrate stage 2 which are movable with respect to the terminal end optical element 8 on the light-exit side of the terminal end optical element 8. Further, the object, which can be opposite to the seal member 30 and the terminal end optical element 8, also includes the substrates P held or retained by the first substrate stage 1 and the second substrate stage 2. Each of the first substrate stage 1 and the second substrate stage 2 is movable to the position opposite to or facing the seal member 30 and the terminal end optical element 8. The seal member 30 is capable of forming the liquid immersion space LS of the liquid LQ between the seal member 30 and the first substrate stage 1 and the second substrate stage 2, by retaining the liquid LQ between the seal member 30 and the first substrate stage 1 and the second substrate stage 2, so that the optical path space for the exposure light EL on the light-exit side of the terminal end optical element 8 is filled with the liquid LQ. The object may include the measuring stage or a cap member etc. as described later on. The liquid immersion space LS, which is formed between the object and the seal member 30 and the terminal end optical element 8, is also simply referred to, on the object, as "liquid immersion area" or the like. The first and second substrate stages 1, 2, the mask stage 3, the measuring stage and the like are each also referred to as "movable body", "movable member", "stage assembly", or the like.

In this embodiment, the seal member 30 forms the liquid immersion space LS between the terminal end optical element 8 and the seal member 30 and the object (for example, at least one of the first substrate stage 1, the second substrate stage 2, and the substrate P) so that a partial area (local area) on the surface of the object is covered with the liquid LQ of the liquid immersion space LS. That is, in this embodiment, the exposure apparatus EX adopts the local liquid immersion system in which the liquid immersion space LS is formed between the terminal end optical element 8 and the seal member 30 and the substrate P so that the partial area on the substrate P is covered with the liquid LQ of the liquid immersion space LS at least during the exposure for the substrate P. When a shot area, among shot areas, which is located at the periphery or circumference of the substrate P is exposed, the liquid immersion space LS protrudes or extends from the substrate P, and a part or portion of opposing surface 15, of the substrate stage which will be described later on, is also covered with the liquid LQ.

The alignment system AL of the measuring station ST2 has an optical element 9 capable of being opposite (opposable) to the object (for example, at least one of the first substrate stage 1, the second substrate stage 2, and the substrate P). The alignment system AL detects, for example, an alignment mark on the substrate P and reference marks etc. on the first and second substrate stages 1, 2 via the optical element 9 in order to obtain the position information about the substrate P. Each of the first substrate stage 1 and the second substrate stage 2 is movable to a position opposite to or facing the optical element 9.

In the following description, the terminal end optical element 8 of the projection optical system PL, which is arranged in the exposure station ST1 in order to radiate the exposure light EL, is appropriately referred to as "first optical element 8". The optical element 9, of the alignment system AL, which is arranged in the measuring station ST2 in order to obtain the position information about the substrate P held by at least one of the first substrate stage 1 and the second substrate stage 2, is appropriately referred to as "second optical element 9". The position, which is opposite to the light exit surface of the first optical element 8 and at which the exposure light EL is radiated from the first optical element 8, is appropriately referred to as "first position". The position, which is opposite to or facing the second optical element 9, is appropriately referred to as "second position". The exposure for the substrate P is performed at the first position. Therefore, the first position can be also referred to as "exposure position". The detection of the mark is performed at the second position. Therefore, the second position can be also referred to as "detecting position" or "measuring position".

As shown in FIG. 1, the exposure apparatus EX is provided with a first area SP1 and a second area SP2 which are defined on the base member BP. The first area SP1 is an area which includes the first position opposite to the first optical element 8 of the projection optical system PL and which is defined in at least a part of the exposure station ST1. The second area SP2 is an area which is different from the first area SP1, and includes the second position opposite to the second optical element 9 of the alignment system AL, and is defined in at least a part of the measuring station ST2. The exposure station ST1 includes the first area SP1 in which the first optical element 8 having the light exit surface via which the exposure light EL exits is arranged. The measuring station ST2 includes the second area SP2 in which the second optical element 9 is arranged to obtain the position information about the substrate P.

In this embodiment, the first area SP1 of the exposure station ST1 and the second area SP2 of the measuring station ST2 are defined in the Y axis direction. The first area SP1 is arranged on the −Y side of the second area SP2. In this embodiment, a third area SP3 is defined between the first area SP1 and the second area SP2. The first substrate stage 1 and the second substrate stage 2 are movable while holding the substrates P respectively in a predetermined area on the base member BP (guide surface GF) including the first area SP1, the second area SP2, and the third area SP3.

In the exposure station ST1, the substrate P is exposed via the projection optical system PL and the liquid LQ. In the measuring station ST2, the measurement in relation to the exposure and the exchange of the substrate P are performed. The first substrate stage 1 and the second substrate stage 2 are movable while holding the substrates P respectively between the first area SP1 of the exposure station ST1 and the second area SP2 of the measuring station ST2.

The exposure apparatus EX of this embodiment is provided with a shutter member disclosed, for example, in Japanese Patent Application Laid-open No. 2004-289128, or a member similar to the shutter member, namely a cap member (a cover member, for example, a plate) C which is capable of forming the space holding or retaining the liquid LQ between the first optical element 8 and the cap member C. When the cap member C is positioned at the first position opposite to the light exit surface of the first optical element 8, then the liquid LQ can be retained in the space formed between the cap member C and the light exit surface of the first optical element 8 in the same manner as the first substrate stage 1, the second substrate stage 2, and the substrate P.

As described later on, in this embodiment, the seal member 30 can releasably hold the cap member C so that the cap member C is arranged at the position opposite to or facing the light exit surface of the first optical element 8. In this embodiment, the seal member 30 releasably holds the cap member C so that the cap member C is arranged at the position opposite to the light exit surface of the first optical element 8 when both of the first substrate stage 1 and the second substrate stage 2 are away (separated) from the first area SP1 in which the first optical element 8 is arranged. In this embodiment, although the seal member 30 is used as a cap holder (holding section, holding portion) which holds the cap member C releasably, it is allowable to use another member, for example, such as a clamp mechanism. In such a case, the cap holder may be provided, for example, on a support frame 102 which will be explained later and which supports the projection optical system PL.

The exposure apparatus EX of this embodiment is provided with a first cap holder (first holding portion) CH1 which is provided on the first substrate stage 1 and which releasably holds the cap member C during the exposure for the substrate P held by the first substrate stage 1, and a second cap holder (second holding portion) CH2 which is provided on the second substrate stage 2 and which releasably holds the cap member C during the exposure for the substrate P held by the second substrate stage 2. When the cap member C is held by the first cap holder CH1, the cap member C is movable in accordance with the movement of the first substrate stage 1. When the cap member C is held by the second cap holder CH2, the cap member C is movable in accordance with the movement of the second substrate stage 2.

The exposure apparatus EX of this embodiment further includes a cap member transport system (transport section) HC which transports, to a predetermined position, the cap member C released from one of the seal member 30, the first cap holder CH1, and the second cap holder CH2. The cap member transport system HC can detach or remove the cap member C from the first cap holder CH1 or the second cap holder CH2 to move the cap member C independently from the first substrate stage 1 or the second substrate stage 2. Further, the cap member transport system HC can transport the cap member C independently from the movement of the cap member C associated with the first substrate stage 1 and the movement of the cap member C associated with the second substrate stage 2. Further, the cap member transport system HC can transport the cap member C to a predetermined position different from the seal member 30, the first cap holder CH1, and the second cap holder CH2, for example, to a position outside of the predetermined area on the base member BP described above, etc. In this embodiment, the cap member transport system HC is arranged in the measuring station ST2.

The exposure apparatus EX of this embodiment is a scanning type exposure apparatus (so-called scanning stepper) which projects the image of the pattern of the mask M onto the substrate P while synchronously moving the mask M and the substrate P in a predetermined scanning direction. In this embodiment, a scanning direction (synchronous movement direction) of the substrate P is the Y axis direction, and the scanning direction (synchronous movement direction) of the mask M is also the Y axis direction. The exposure apparatus EX radiates the exposure light EL onto the substrate P via the projection optical system PL and the liquid LQ to expose the substrate P, while moving the substrate P in the Y axis direction with respect to the projection area of the projection optical system PL, and moving the mask M in the Y axis direction with respect to the illumination area of the illumination system IL in synchronization with the movement of the substrate P in the Y axis direction. Accordingly, the image of the pattern of the mask M is projected onto the substrate P.

The exposure apparatus EX is provided with a body 100 including a column 101 which is provided, for example, on the floor in a clean room, and a support frame 102 which is provided on the column 101 via an anti-vibration device 103. The column 101 has a support surface 105 which supports the base member BP via an anti-vibration device 104. The support frame 102 supports the projection optical system PL, the alignment system AL, the focus/leveling system FL, etc. The anti-vibration device 104, which is arranged between the base member BP and the support surface 105, includes an active anti-vibration device provided with a predetermined actuator and a damper mechanism.

At first, the illumination system IL and the projection optical system PL will be explained. The illumination system IL illuminates the predetermined illumination area of the mask M with the exposure light EL having a uniform illuminance distribution. Lights usable as the exposure light EL radiated from the illumination system IL include, for example, emission lines (g-ray, h-ray, i-ray) radiated, for example, from a mercury lamp, far ultraviolet light beams (DUV light beams) such as the KrF excimer laser beam (wavelength: 248 nm), and vacuum ultraviolet light beams (VUV light beams) such as the ArF excimer laser beam (wavelength: 193 nm) and the $F_2$ laser beam (wavelength: 157 nm). In this embodiment, the ArF excimer laser beam is used as the exposure light EL.

The projection optical system PL projects the image of the pattern of the mask M onto the substrate P at a predetermined projection magnification. The projection optical system PL has a plurality of optical elements. The optical elements are held by a barrel PK. In this embodiment, the projection optical system PL is of a reduction system having the projection magnification which is, for example, 1/4, 1/5, 1/8 or the like. The projection optical system PL may be any one of the 1× magnification system and the magnifying system. In this embodiment, an optical axis AX of the projection optical system PL is parallel to the Z axis direction. The projection optical system PL may be any one of a dioptric system including no catoptric optical element, a catoptric system including no dioptric optical element, and a catadioptric system including dioptric and catoptric optical elements. The projection optical system PL may form any one of the inverted image and the erecting image.

The exposure light EL, radiated from the illumination system IL and passing through the mask M, comes into the projection optical system PL from the object plane side of the projection optical system PL. The projection optical system PL is capable of making the exposure light EL coming from the object plane side to exit from the light exit surface (lower surface) of the first optical element 8 so that the exposure light EL is radiated onto the substrate P.

Next, an explanation will be made about the mask stage 3 and the mask stage-driving system 4. The mask stage 3 has a mask holder which holds the mask M. The mask stage 3 is movable while holding the mask M with the mask holder. The mask stage-driving system 4 includes, for example, an actuator such as a linear motor or a voice coil motor. The mask stage-driving system 4 is capable of moving the mask stage 3 holding the mask M. The operation of the mask stage-driving system 4 is controlled by the controller 7. The mask stage 3 is movable in the X axis, Y axis, and θZ directions by the mask stage-driving system 4 while holding the mask M by the mask holder. The controller 7 is capable of using the mask stage-driving system 4 to move the mask stage 3, to thereby adjust the position of the mask M held by the mask stage 3 in relation to the X axis, Y axis, and θZ directions. In this embodiment, the mask stage 3 is supported by a mask base (not shown) supported independently from the support frame 102 in terms of the vibration.

Figure 2:
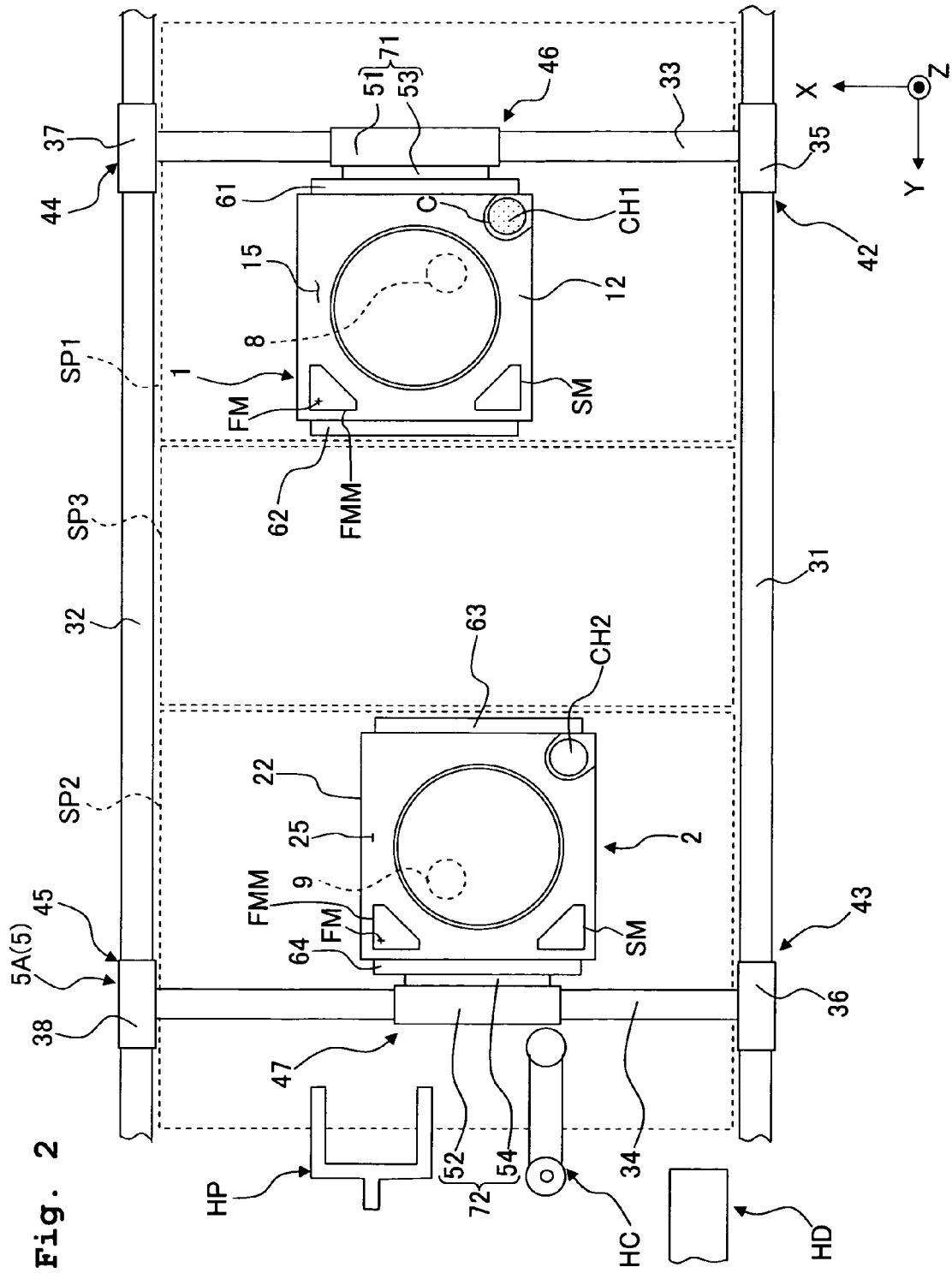
FIG. 2 shows a plan view of a first substrate stage and a second substrate stage as viewed from an upper position.
Figure 3:
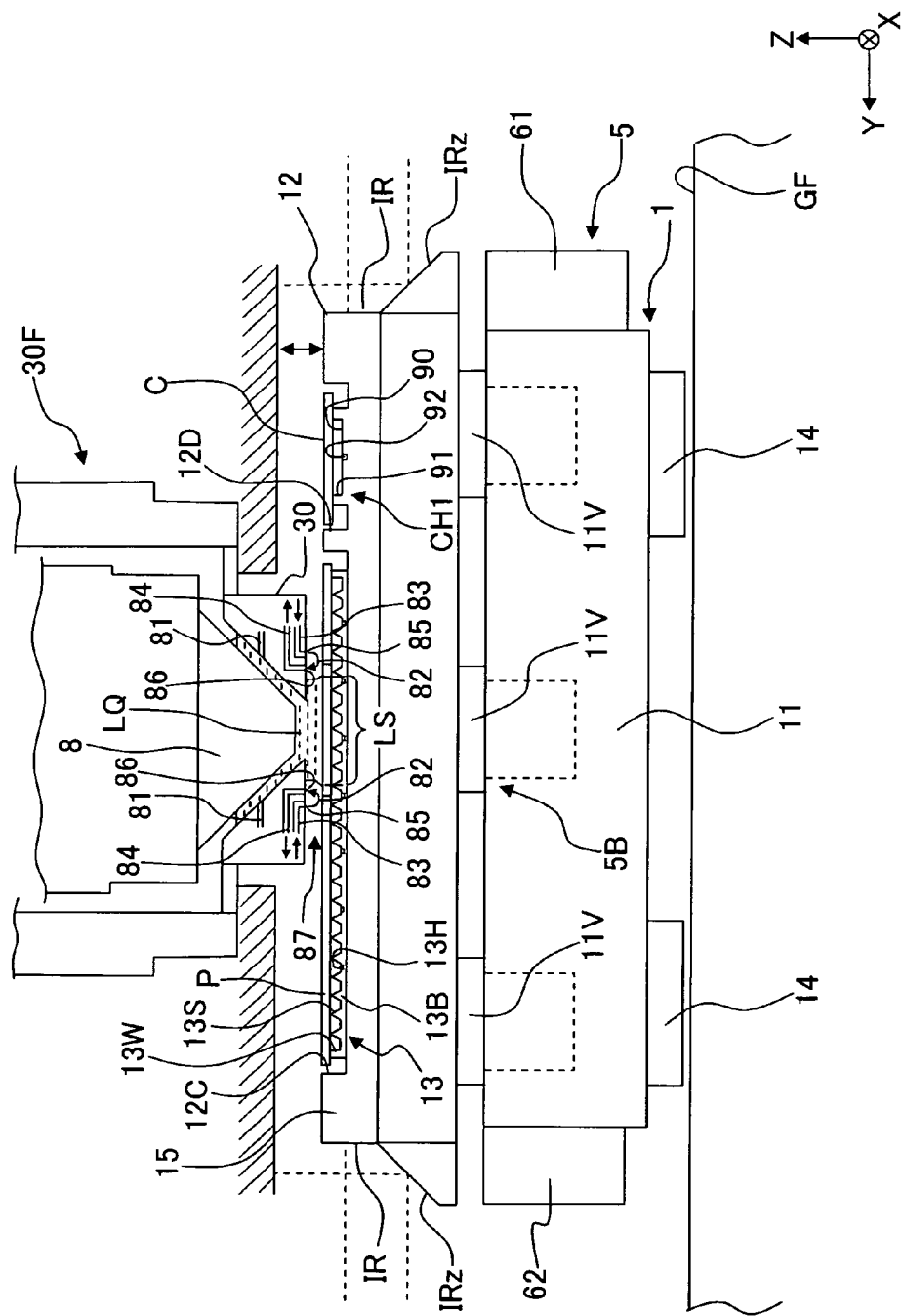
FIG. 3 shows a part of the exposure apparatus according to the first embodiment.

Next, an explanation will be made with reference to FIGS. 1, 2, and 3 about the first and second substrate stages 1, 2 and the substrate stage-driving system 5. FIG. 2 is a plan view of the first and second substrate stages 1, 2 and the substrate stage-driving system 5 as viewed from an upper position. FIG. 3 is a magnified view showing the vicinity of the first substrate stage 1.

The first substrate stage 1 has a stage body 11, and a first substrate table 12 supported by the stage body 11 and having a substrate holder 13 which detachably holds the substrate P. The stage body 11 is supported in a non-contact manner by the upper surface (guide surface GF) of the base member BP with, for example, an air bearing 14. The first substrate table 12 has an opposing surface 15 which is capable of being opposite to (opposable to) the seal member 30 and the first optical element 8. The substrate holder 13 is provided at the inside of a recess 12C which is formed at a predetermined position of the opposing surface 15 of the first substrate table 12. At least a part of the area of, the opposing surface 15, around the recess 12C of the first substrate table 12, is substantially flat, and has an approximately same height as that of (is flush with) the surface of the substrate P held by the substrate holder 13.

As shown in FIG. 3, the substrate holder 13 is provided with a base member 13B which has the upper surface capable of being opposite to the lower surface of the substrate P arranged at the inside of the recess 12C; a support portion 13S which is provided on the upper surface of the base member 13B and which is constructed of a plurality of pin-shaped members supporting the lower surface of the substrate P; and a circumferential wall 13W which has the upper surface opposite to the lower surface of the substrate P and which is provided to surround the support portion 13S. A suction port 13H, which is connected to an unillustrated vacuum system, is provided on the upper surface of the base member 13B. The controller 7 drives the vacuum system to suck, via the suction port 13H, a gas present in a space formed by the upper surface of the base member 13B, the circumferential wall 13W and the lower surface of the substrate P supported by the support portion 13S to negatively pressurize the space. By doing so, the controller 7 holds the lower surface of the substrate P so as to attract the lower surface to the support portion 13S, Namely, the substrate holder 13 of this embodiment includes a so-called pin chuck mechanism. The controller 7 can release or stop the suction operation, performed by the aid of the suction port 13H, to thereby separate or release the substrate P from the substrate holder 13. In this way, the substrate holder 13 releasably holds the substrate P.

The second substrate stage 2 has the same construction as that of the first substrate stage 1. The second substrate stage 2 has a stage body 21, and a second substrate table 22 supported by the stage body 21 and having a substrate holder 23 which detachably holds the substrate P. The stage body 21 is supported in a non-contact manner by the upper surface (guide surface GF) of the base member BP with, for example, an air bearing 24. The second substrate table 22 has an opposing surface 25 which is capable of being opposite to (opposable to) the seal member 30 and the first optical element 8. The substrate holder 23 is provided at the inside of a recess 22C which is formed at a predetermined position of the opposing surface 25 of the second substrate table 22. At least a part of the area, of the opposing surface 25, around the recess 22C of the second substrate table 22 is substantially flat, and has an approximately same height as that of (is flush with) the surface of the substrate P held by the substrate holder 23.

The substrate holder 23 is constructed in a same manner as the substrate holder 13. The substrate holder 23 includes the pin chuck mechanism and releasably holds the substrate P.

As shown in FIG. 2, reference members FMM each having a reference mark FM formed therein and measuring members SM each having a transmission portion (window) required for various types of measurement formed therein are provided on the opposing surfaces 15, 25 of the first substrate stage 1 and the second substrate stage 2 respectively. The reference marks FM are used to perform detection, by an unillustrated mask alignment system, of the positional relationship with respect to the mark formed on the mask. Further, the reference marks FM are used to perform determination, by the alignment system AL, of the positions of alignment marks formed in the shot areas, respectively, of the substrate P on the substrate stage 1, 2 (or to perform determination of the reference marks FM with respect to the alignment marks) as described later on. An unillustrated optical sensor is provided under or below the measuring member SM. Those usable as the optical sensor include an optical sensor for constructing at least a part of a spatial image measuring system as disclosed, for example, in the specification of United States Patent Application Publication No. 2002/0041377, etc. Alternatively, the optical sensor may be an optical sensor capable of measuring the intensity (transmittance) of the exposure light EL as disclosed, for example, in United States Patent Application Publication No. 2007/0127006 and European Patent Application Publication No. 1791164, etc. Various types of detectors or measuring devices, which include an uneven illuminance measuring device, an illuminance meter, a wave aberration measuring device and the like, may be arranged under or below the measuring member SM instead of the optical sensor or together with the optical sensor. The light beam (light) is transmitted through the transmission portion provided for the measuring member SM, and the light beam comes into the optical sensor or the measuring device.

The substrate stage-driving system 5 includes an actuator such as a linear motor or a voice coil motor. The substrate stage-driving system 5 is capable of moving each of the first substrate stage 1 and the second substrate stage 2. The operation of the substrate stage-driving system 5 is controlled by the controller 7.

The first substrate stage 1 is movable by the substrate stage-driving system 5 in the directions of six degrees of freedom of the X axis, Y axis, Z axis, θX, θY, and θZ directions on the base member BP while holding the substrate P with the substrate holder 13. The controller 7 uses the substrate stage-driving system 5 to move the first substrate stage 1, thereby making it possible to adjust the position of the substrate P held by the first substrate stage 1 in relation to the X axis, Y axis, Z axis, θX, θY, and θZ directions.

The second substrate stage 2 is movable by the substrate stage-driving system 5 in the directions of six degrees of freedom of the X axis, Y axis, Z axis, θX, θY, and θZ directions on the base member BP while holding the substrate P with the substrate holder 23. The controller 7 uses the substrate stage-driving system 5 to move the second substrate stage 2, thereby making it possible to adjust the position of the substrate P held by the second substrate stage 2 in relation to the X axis, Y axis, Z axis, θX, θY, and θZ directions.

The substrate stage-driving system 5 is provided with a coarse movement system 5A which moves each of the stage bodies 11, 21 on the base member BP, and a fine movement system 5B which moves the substrate tables 11, 22 on the stage bodies 11, 21 respectively.

The coarse movement system 5A includes, for example, an actuator such as a linear motor, and is capable of moving each of the stage bodies 11, 21 on the base member BP in the X axis, Y axis, and θZ directions. When each of the stage bodies 11, 21 is moved in the X axis, Y axis, and θZ directions by the coarse movement system 5A, then the substrate tables 12, 22, provided on the stage bodies 11, 21 respectively, are also moved in the X axis, Y axis, and θZ directions together with the stage bodies 11, 21 respectively.

With reference to FIG. 2, the coarse movement system 5A, which moves the first substrate stage 1 and the second substrate stage 2, is provided with a plurality of linear motors 42, 43, 44, 45, 46, 47. The coarse movement system 5A is provided with a pair of Y axis guide members 31, 32 extending in the Y axis direction. The Y axis guide members 31, 32 are provided with magnet units each having a plurality of permanent magnets respectively. The Y axis guide member 31, as one of the pair, supports two slide members 35, 36 movably in the Y axis direction. The Y axis guide member 32, as the other of the pair, supports two slide members 37, 38 movably in the Y axis direction. Each of the slide members 35, 36, 37, 38 is provided with a coil unit having an armature coil. That is, in this embodiment, Y axis linear motors 42, 43, 44, 45 of the moving coil type are formed by the slide members 35, 36, 37, 38 having the coil units and the Y axis guide members 31, 32 having the magnet units.

Further, the coarse movement system 5A is provided with a pair of X axis guide members 33, 34 extending in the X axis direction. The X axis guide members 33, 34 are provided with coil units having armature coils respectively. The X axis guide member 33, as one of the pair, supports a slide member 51 movably in the X axis direction. The X axis guide member 34, as the other of the pair, supports a slide member 52 movably in the X axis direction. Each of the slide members 51, 52 is provided with a magnet unit having a plurality of permanent magnets. With reference to FIG. 2, the slide member 51 is connected to the stage body 11 of the first substrate stage 1, and the slide member 52 is connected to the stage body 21 of the second substrate stage 2. That is, in this embodiment, an X axis linear motor 46 of the moving magnet type is formed by the slide member 51 having the magnet unit and the X axis guide member 33 having the coil unit. Similarly, an X axis linear motor 47 of the moving magnet type is formed by the slide member 52 having the magnet unit and the X axis guide member 34 having the coil unit. With reference to FIG. 2, the first substrate stage 1 (stage body 11) is moved in the X axis direction by the X axis linear motor 46, and the second substrate stage 2 (stage body 21) is moved in the X axis direction by the X axis linear motor 47.

The slide members 35, 37 are fixed to one end and the other end of the X axis guide member 33 respectively; and the slide members 36, 38 are fixed to one end and the other end of the X axis guide member 34 respectively. Therefore, X axis guide member 33 is movable in the Y axis direction by the Y axis linear motors 42, 44; and the X axis guide member 34 is movable in the Y axis direction by the Y axis linear motors 43, 45. With reference to FIG. 2, the first substrate stage 1 (stage body 11) is moved in the Y axis direction by the Y axis linear motors 42, 44, and the second substrate stage 2 (stage body 21) is moved in the Y axis direction by the Y axis linear motors 43, 45.

The position of the first substrate stage 1 in the θZ direction can be controlled by making the thrust forces generated by the pair of Y axis linear motors 42, 44 respectively to be slightly different between the Y axis linear motors 42, 44; and the position of the second substrate stage 2 in the θZ direction can be controlled by making the thrust forces generated by the pair of Y axis linear motors 43, 45 respectively to be slightly different between the Y axis linear motors 43, 45.

As shown in FIG. 1, the fine movement system 5B includes actuators 11V, 21V such as voice coil motors which are intervened between the stage bodies 11, 21 and the substrate tables 12, 22 respectively; and unillustrated measuring devices (for example, encoder systems) which measure the driving amounts of the actuators respectively. The fine movement system 5B is capable of moving the substrate tables 12, 22 on the stage bodies 11, 21 respectively at least in the Z axis, θX, and θY directions. Further, the fine movement system 5B is capable of moving (finely moving) the substrate tables 12, 22 on the stage bodies 11, 21 respectively in the X axis, Y axis, and θZ directions.

As described above, the driving system 5, which includes the coarse movement system 5A and the fine movement system 5B, is capable of moving each of the first substrate table 12 and the second substrate table 22 in the directions of six degrees of freedom of the X axis, Y axis, Z axis, θX, θY, and θZ directions.

The first substrate stage 1 (stage body 11) and the second substrate stage 2 (stage body 21) are releasably connected to the slide members 51, 52 via joint members respectively, as disclosed, for example, in Published Japanese Translation of PCT International Publication for Patent Application No. 2000-505958 (corresponding to U.S. Pat. No. 5,969,441), Published Japanese Translation of PCT International Publication for Patent Application No. 2000-511704 (corresponding to U.S. Pat. No. 5,815,246), Japanese Patent Application Laid-open No. 2001-223159 (corresponding to U.S. Pat. No. 6,498,350), and the like.

As shown in FIGS. 1 and 2, the first substrate stage 1 is provided with a first joint member 61 which is provided on a side surface of the stage body 11 on the −Y side, and a second joint member 62 which is provided on a side surface on the +Y side of the stage body 11. Similarly, the second substrate stage 2 is provided with a third joint member 63 which is provided on a side surface of the stage body 21 on the −Y side, and a fourth joint member 64 which is provided on a side surface on the +Y side of the stage body 21.

On the other hand, the substrate stage-driving system 5 is provided with a joint member 53 which is provided for the slide member 51, and a joint member 54 which is provided for the slide member 52. The joint member 53 is provided on the side surface of the slide member 51 on the +Y side so that the joint member 53 is directed or oriented toward the measuring station ST2 (toward the +Y side). The joint member 54 is provided on the side surface of the slide member 52 on the −Y side so that the joint member 54 is directed toward the exposure station ST1 (toward the −Y side).

The joint member 53 is releasably connected to the slide member 51 as described later on, and the slide member 51 and the joint member 53 are movable together. Further, the joint member 54 is releasably connected to the slide member 52 as described later on, and the slide member 52 and the joint member 54 are movable together. Therefore, the linear motors 42, 44, 46 are capable of moving the slide member 51 and the joint member 53 together, and the linear motors 43, 45, 47 are capable of moving the slide member 52 and the joint member 54 together.

The first joint member 61 of the stage body 11 and the third joint member 63 of the stage body 21 are successively connected releasably to the joint member 53 provided for the slide member 51. The second joint member 62 of the stage body 11 and the fourth joint member 64 of the stage body 21 are successively connected releasably to the joint member 54 provided for the slide member 52.

Namely, the stage body 11 of the first substrate stage 1 and the stage body 21 of the second substrate stage 2 are successively connected releasably to the joint member 53 provided for the slide member 51 via the first joint member 61 and the third joint member 63; and the stage body 11 of the first substrate stage 1 and the stage body 21 of the second substrate stage 2 are successively connected releasably to the joint member 54 provided for the slide member 52 via the second joint member 62 and the fourth joint member 64.

In the following description, the joint member 53 to which the stage body 11 of the first substrate stage 1 and the stage body 21 of the second substrate stage 2 are successively connected releasably and the slide member 51 which is fixed to the joint member 53 are appropriately referred to as "first connecting member 71" in combination. Further, the joint member 54 to which the stage body 11 of the first substrate stage 1 and the stage body 21 of the second substrate stage 2 are successively connected releasably and the slide member 52 which is fixed to the joint member 54 are appropriately referred to as "second connecting member 72" in combination.

Therefore, the linear motors 42, 44, 46 are capable of moving the first connecting member 71, and the linear motors 43, 45, 47 are capable of moving the second connecting member 72.

The controller 7 executes, on the base member BP, the release of the connection between the first connecting member 71 and the first substrate stage 1 (or the second substrate stage 2) and the release of the connection between the second connecting member 72 and the second substrate stage 2 (or the first substrate stage 1), as well as executes the connection between the first connecting member 71 and the second substrate stage 2 (or the first substrate stage 1) and the connection between the second connecting member 72 and the first substrate stage 1 (or the second substrate stage 2), at a predetermined timing. That is, the controller 7 executes the exchange operation for the first connecting member 71 and the second connecting member 72 with respect to the first substrate stage 1 and the second substrate stage 2 at the predetermined timing. In this embodiment, as an example, the exchange operation for the first connecting member 71 and the second connecting member 72 with respect to the first substrate stage 1 and the second substrate stage 2 is executed in the third area SP3 on the base member BP.

The first connecting member 71 is alternately connected to the first joint member 61 of the stage body 11 and the third joint member 63 of the stage body 21. The second connecting member 72 is alternately connected to the second joint member 62 of the stage body 11 and the fourth joint member 64 of the stage body 21. That is, the first connecting member 71 is alternately connected to the stage body 11 of the first substrate stage 1 and the stage body 21 of the second substrate stage 2 via the first joint member 61 and the third joint member 63 respectively; and the second connecting member 72 is alternately connected to the stage body 11 of the first substrate stage 1 and the stage body 21 of the second substrate stage 2 via the second joint member 62 and the fourth joint member 64 respectively.

The first connecting member 71 moves one of the first substrate stage 1 and the second substrate stage 2, to which the first connecting member 71 is connected, by the driving of the linear motors 42, 44, 46; and the second connecting member 72 moves the other of the first and second substrate stages 1, 2, to which the second connecting member 72 is connected, by the driving of the linear motors 43, 45, 47. The first substrate stage 1, which is connected to at least one of the first connecting member 71 and the second connecting member 72, is movable by the substrate stage-driving system 5 while holding the substrate P in the predetermined area on the base member BP including the first area SP1, the second area SP2, and the third area SP3. Similarly, the second substrate stage 2, which is connected to at least one of the first connecting member 71 and the second connecting member 72, is movable by the substrate stage-driving system 5 while holding the substrate P, independently from the first substrate stage 1, in the predetermined area on the base member BP including the first area SP1, the second area SP2, and the third area SP3.

Next, an explanation will be made with reference to FIG. 1 about an example of the measuring system 6 which measures the position information about the mask stage 3, the first substrate stage 1, and the second substrate stage 2.

The measuring system 6 has a laser interferometer 6M which is capable of radiating the measuring beam (measuring light) for the position measurement onto a measuring mirror 3R provided on the mask stage 3. Although detailed illustration is omitted, the measuring mirror 3R has a reflecting surface which is substantially parallel to the YZ plane and a reflecting surface which is substantially parallel to the XZ plane. The laser interferometer 6M radiates a measuring light having the measuring axis of the X axis and a measuring light having a measuring axis of the Y axis onto the reflecting surfaces of the measuring mirror 3R respectively. The measuring system 6 is capable of measuring the position information about the mask stage 3 by radiating the measuring lights from the laser interferometer 6M onto the measuring mirror 3R. In this embodiment, the measuring system 6 is capable of measuring the position information about the mask stage 3 in relation to the X axis, Y axis, and θZ directions by using the measuring mirror 3R provided on the mask stage 3.

The controller 7 drives the mask stage-driving system 4 based on the measurement result of the measuring system 6 including the laser interferometer 6M to control the position of the mask M held by the mask stage 3.

The measuring system 6 further includes laser interferometers 6P capable of radiating measuring lights for the position measurement onto a measuring mirror 1R which is provided on the first substrate table 12 of the first substrate stage 1 and onto a measuring mirror 2R which is provided on the second substrate table 22 of the second substrate stage 2 respectively. The laser interferometers 6P are provided for the exposure station ST1 and the measuring station ST2 respectively. Although detailed illustration is omitted, each of the measuring mirrors 1R, 2R has a reflecting surface which is substantially parallel to the YZ plane and a reflecting surface which is substantially parallel to the XZ plane. The laser interferometer 6P radiates a measuring light having the measuring axis of the X axis and a measuring light having the measuring axis of the Y axis onto each of the reflecting surfaces of the measuring mirrors 1R, 2R.

In this embodiment, the measuring system 6 further includes laser interferometers (Z interferometers) 6Pz capable of measuring the position information in the Z axis direction about the first and second substrate tables 12, 22 as disclosed, for example, in Japanese Patent Application Laid-open No. 2000-323404 (corresponding to U.S. Pat. No. 7,206,058), Published Japanese Translation of PCT International Publication for Patent Application No. 2001-513267 (corresponding to U.S. Pat. No. 6,208,407), and the like. The laser interferometers 6Pz are provided for the exposure station ST1 and the measuring station ST2 respectively. Measuring mirrors 1Rz, 2Rz, having reflecting surfaces which area directed obliquely upwardly and onto which the measuring lights are irradiated from the laser interferometers 6Pz, are arranged on the first and second substrate tables 12, 22 respectively. The laser interferometers 6Pz radiate the measuring lights having the measuring axis of the Z axis onto the respective reflecting surfaces of the measuring mirrors 1Rz, 2Rz.

The laser interferometers 6P, 6Pz, which are provided for the exposure station ST1, measure the position information about the first substrate table 12 (or the second substrate table 22) existing in the exposure station ST1. The laser interferometers 6P, 6Pz, which are provided for the measuring station ST2, measure the position information about the second substrate table 22 (or the first substrate table 12) existing in the measuring station ST2.

The measuring system 6 can radiate the measuring lights from the laser interferometers 6P, 6Pz onto the measuring mirrors 1R, 2R, 1Rz, 2Rz to measure the position informations about the first substrate stage 1 and the second substrate stage 2 respectively. In this embodiment, the measuring system 6 is capable of measuring the position information in relation to the directions of six degrees of freedom of the X axis, Y axis, Z axis, θX, θY, and θZ directions of the first substrate table 12 by using the measuring mirrors 1R, 1Rz provided on the first substrate table 12. Further, the measuring system 6 is capable of measuring the position information in relation to the directions of six degrees of freedom of the X axis, Y axis, Z axis, θX, θY, and θZ directions of the second substrate table 22 by using the measuring mirrors 2R, 2Rz provided on the second substrate table 22.

The controller 7 drives the substrate stage-driving system 5 based on the measurement result of the measuring system 6 including the laser interferometers 6P, 6Pz to control the positions of the substrate P held by the first substrate stage 1 and the substrate P held by the second substrate stage 2.

The measuring system 6 further includes the alignment system AL including the second optical element 9 and the focus/leveling-detecting system FL. The alignment system AL is arranged in the measuring station ST2, and is capable of detecting the alignment mark of the substrate P and the reference mark FM (see FIG. 2) arranged on each of the opposing surfaces 15, 25 of the first and second substrate tables 12, 22. The focus/leveling-detecting system FL is arranged in the measuring station ST2, and detects the surface position information about the surfaces of the substrates P held by the first and second substrate tables 12, 22 (position information in relation to the Z axis, θX, and θY directions). The focus/leveling-detecting system FL alternately detects, in the measuring station ST2, the surface position information about the surface of the substrate P held by the first substrate table 12 and the surface position information about the surface of the substrate P held by the second substrate table 22.

Next, the seal member 30 will be explained with reference to FIG. 3. As described above, the seal member 30 of this embodiment includes the seal member as disclosed, for example, in Japanese Patent Application Laid-open Nos. 2004-289126 and 2004-289128, and the like, and is provided with a flow passage 81 supplying and recovering the liquid LQ with respect to the optical path space for the exposure light EL. Those connected to the flow passage 81 include a liquid supply device (not shown) which supplies the liquid LQ to the optical path space for the exposure light EL via the flow passage 81, and a liquid recovery device (not shown) which recovers the liquid LQ. The liquid supply device is capable of supplying the liquid LQ for forming the liquid immersion space LS to the optical path space for the exposure light EL via the flow passage 81. The liquid recovery device is capable of recovering the liquid LQ in the liquid immersion space LS via the flow passage 81. The liquid supply device is provided with, for example, a liquid supply section which is capable of feeding the liquid LQ, a supply tube which has one end connected to the liquid supply section, a tank which accommodates the liquid LQ, a filter, a pressurizing pump and the like. The liquid recovery device is provided with, for example, a liquid recovery section which is capable of recovering the liquid LQ, a recovery tube which has one end connected to the liquid recovery section, a tank which accommodates the liquid LQ, a filter, a suction pump and the like. It is not necessarily indispensable that the exposure apparatus EX is provided with all of the liquid supply device and the liquid recovery device as well as the tank, the filter, the pump and the like constructing the liquid supply and recovery devices. As a part or all of these components, an equipment of the factory or the like in which the exposure apparatus EX is installed may be used instead.

The seal member 30 of this embodiment is provided with a gas inlet port 83 and a gas outlet port 84 which form a gas seal 82 for confining the liquid LQ between the lower surface of the seal member 30 and the surface of the object (surface of the substrate P in FIG. 3) opposite to or facing the lower surface of the seal member 30. Those formed on the lower surface of the seal member 30 include a first groove 85 which is connected to the gas inlet port 83 and which is formed to have an annular form to surround the optical path space for the exposure light EL, and a second groove 86 which is connected to the gas outlet port 84 and which is formed to have an annular form to surround the optical path space for the exposure light EL. The first groove 85 is formed at the outside of the second groove 86 with respect to the optical path space for the exposure light EL.

The seal member 30 of this embodiment is capable of forming a gas bearing 87 with respect to the surface of the object (surface of the substrate P in FIG. 3) facing the lower surface of the seal member 30. The controller 7 is capable of forming the gas bearing 87 between the lower surface of the seal member 30 and the surface of the object (surface of the substrate P) opposite to the lower surface of the seal member 30 by gas introducing (supplying) operation via the gas inlet port 83 and gas discharging (sucking) operation via the gas outlet port 84. The gas bearing 87 of the pressurizing vacuum type is formed between the lower surface of the seal member 30 and the surface of the object (surface of the substrate P). A gap (of, for example, 0.1 to 1.0 mm) is maintained by the gas bearing 87 between the lower surface of the seal member 30 and the surface of the object (surface of the substrate P).

The seal member 30 is supported by the support frame 102 via a support mechanism 30F. The support mechanism 30F includes, for example, a spring member, an elastic member such as a flexure, or a flexible member, and supports the seal member 30 flexibly (swingably). The gas bearing 87 is formed between the lower surface of the seal member 30 and the surface of the object (surface of the substrate P), and the seal member 30 is flexibly supported by the support mechanism 30F. Therefore, even when the position and the posture of the object (substrate P) facing the lower surface of the seal member 30 are changed, the position and the posture of the seal member 30 are changed to follow the change of the position and the posture of the object (substrate P). Therefore, even when the position and the posture of the object (substrate P) are changed, the gap is maintained between the lower surface of the seal member 30 and the surface of the object (substrate P).

Next, the cap member C will be explained. The cap member C is a member which is capable of holding or retaining the liquid LQ between the cap member C and the first optical element 8 as disclosed, for example, in Japanese Patent Application Laid-open No. 2004-289128. The cap member C is formed in conformity with the size and the shape of the liquid immersion space LS formed by the seal member 30. In this embodiment, the cap member C is a member which has approximately the same thickness as that of the substrate P and which is substantially circular and plate-shaped in the XY plane. A surface (upper surface) of the cap member C is liquid-repellent with respect to the liquid LQ. At least the upper surface of the cap member C, which faces the light exit surface of the first optical element 8 and which makes contact with the liquid LQ, is liquid-repellent. In this embodiment, the lower surface of the cap member C, which is different from the upper surface making contact with the liquid LQ, is also liquid-repellent. In this embodiment, the cap member C is formed of a liquid-repellent material such as fluorine-based resin materials including polytetrafluoroethylene. Alternatively, the cap member C may be formed of a predetermined metal such as stainless steel or titanium, and the surface thereof may be coated with a liquid-repellent material. The cap member C is capable of retaining the liquid LQ between the cap member C and the first optical element 8 by being arranged at a position opposite to or facing the light exit surface of the first optical element 8.

Next, the first cap holder CH1 and the second cap holder CH2 will be explained. The exposure apparatus EX of this embodiment is provided with the first cap holder CH1 which is provided on the first substrate table 12 of the first substrate stage 1 and which releasably holds the cap member C, and the second cap holder CH2 which is provided on the second substrate table 22 of the second substrate stage 2 and which releasably holds the cap member C.

The first cap holder CH1 is provided at a predetermined position on the first substrate table 12, and the second cap holder CH2 is provided at a predetermined position on the second substrate table 22. In this embodiment, the first substrate stage 1 which includes the stage body 11 and the first substrate table 12 and the second substrate stage 2 which includes the stage body 21 and the second substrate table 22 have approximately the same shape and the same size. The first cap holder CH1 and the second cap holder CH2 are provided at approximately identical positions on the first and second substrate tables 12, 22 respectively. In this embodiment, each of the first and second substrate tables 12, 22 of the first and second substrate stages 1, 2 is substantially rectangular in the XY plane; and four corners are provided for each of the opposing surfaces 15, 25 of the first and second substrate tables 12, 22. The first and second cap holders CH1, CH2 are arranged each at a corner, among the four corners, which is disposed on the −X side and the −Y side of the opposing surfaces 15, 25 of the first and second substrate tables 12, 22 respectively.

As shown in FIG. 3, the first cap holder CH1 is provided at the inside of a recess 12D which is formed at a predetermined position of the opposing surface 15 of the first substrate table 12. An upper surface 90, which is capable of being opposite to or facing the lower surface of the cap member C arranged inside the recess 12D, is provided at the inside of the recess 12D. A circumferential wall 91, which has an upper surface opposite to the circumferential edge area of the lower surface of the cap member C, is provided on the upper surface 90. A suction port 92, which is connected to an unillustrated vacuum system, is provided on the upper surface 90. The controller 7 drives the vacuum system to suck, via the suction port 92, a gas in the space formed by the upper surface 90, the circumferential wall 91, and the lower surface of the cap member C supported by the circumferential wall 91, thereby negatively pressurizing the space and thus holding the lower surface of the cap member C by suction-attraction. That is, the first cap holder CH1 of this embodiment includes a so-called vacuum chuck mechanism. The controller 7 can separate the cap member C away from the upper surface 90 (circumferential wall 91) of the first cap holder CH1 by stopping or releasing the sucking operation having been performed via the suction port 92. As described above, the first cap holder CH1 releasably holds the lower surface of the cap member C facing the first cap holder CH1.

The second cap holder CH2 has a construction same as that of the first cap holder CH1, and is provided at the inside of a recess formed at a predetermined position of the opposing surface 25 of the second substrate table 22. The second cap holder CH2 also releasably holds the lower surface of the cap member C facing the second cap holder CH2.

The opposing surface 15 of the first substrate table 12 is arranged around the upper surface of the cap member C held by the first cap holder CH1. The upper surface of the cap member C held by the first cap holder CH1 is substantially flush with the opposing surface 15 of the first substrate table 12. Similarly, the opposing surface 25 of the second substrate table 22 is arranged around the upper surface of the cap member C held by the second cap holder CH2. The upper surface of the cap member C held by the second cap holder CH2 is substantially flush with the opposing surface 25 of the second substrate table 22.

In this embodiment, the exposure apparatus EX is provided with one piece of the cap member C. Therefore, when the cap member C is held by the first cap holder CH1 of the first substrate table 12, then the cap member C is not held by the second cap holder CH2 of the second substrate table 22, and nothing is held or present in the second cap holder CH2 in this state (the second cap holder CH2 is exposed). Similarly, when the cap member C is held by the second cap holder CH2 of the second substrate table 22, then the cap member C is not held by the first cap holder CH1 of the first substrate table 12, and nothing is held or present in the first cap holder CH1 in this state (the first cap holder CH1 is exposed).

In this embodiment, the first cap holder CH1 holds the cap member C during the exposure for the substrate P held by the first substrate stage 1 (first substrate table 12). The second cap holder CH2 holds the cap member C during the exposure for the substrate P held by the second substrate stage 2 (second substrate table 22).

In this embodiment, the seal member 30 can releasably hold the cap member C so that the cap member C is arranged at the position opposite to or facing the light exit surface of the first optical element 8. The seal member 30 holds the cap member C so that the cap member C is arranged at the position opposite to or facing the light exit surface of the first optical element 8 when each of the first substrate stage 1 and the second substrate stage 2 is away from the first optical element 8. That is, even when the first substrate stage 1 and the second substrate stage 2 are away from the first optical element 8, the seal member 30 is not away from the position under or below the first optical element 8. Accordingly, the liquid LQ is not separated and away from the first optical element 8.

As described above, the seal member 30 of this embodiment is capable of forming the gas bearing 87 between the seal member 30 and the surface of the object arranged at the position opposite to or facing the lower surface of the seal member 30. The seal member 30 can hold the cap member C in the state that the predetermined gap is maintained between the lower surface of the seal member 30 and the upper surface of the cap member C by utilizing the attracting action generated by forming the gas bearing 87 between the seal member 30 and the cap member C. The seal member 30 releasably holds the upper surface of the cap member C opposite to or facing the seal member 30.

Figure 4:
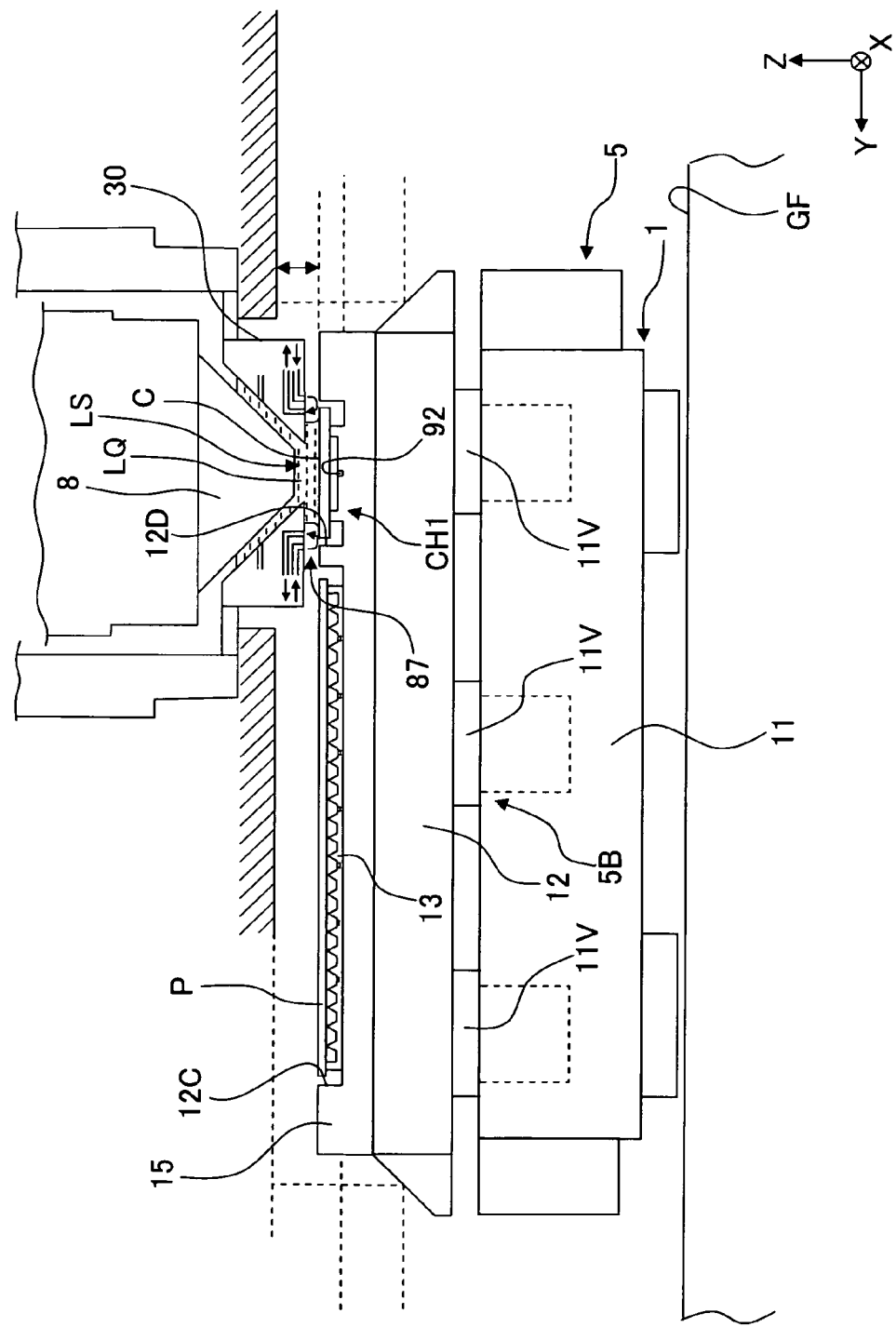
FIG. 4 illustrates an example of the operation of the exposure apparatus according to the first embodiment.

Next, an explanation will be made with reference to FIGS. 4 and 5 about an example of the operation of the cap member C. For example, when the cap member C, held by the first cap holder CH1, is to be held by the seal member 30, the controller 7 controls the substrate stage-driving system 5, in the state that the liquid immersion space LS is formed between the first optical element 8 and the seal member 30 and the first substrate stage 1 (including the substrate P), so that as shown in FIG. 4 the first substrate stage 1 is moved in the XY directions with respect to the first optical element 8 and the seal member 30, thereby making the light exit surface of the first optical element 8 and the lower surface of the seal member 30 to be opposite to or face the upper surface of the cap member C held by the first cap holder CH1. By doing so, the liquid immersion space LS is formed between the first optical element 8 and the seal member 30 and the upper surface of the cap member C. The gas bearing 87 is formed between the lower surface of the seal member 30 and the upper surface of the cap member C.

In this situation, the position information about the first substrate table 12 is measured by the measuring system 6. The controller 7 controls the substrate stage-driving system 5 based on the measurement result of the measuring system 6 to thereby make it possible to arrange, at a desired position, the cap member C held by the first cap holder CH1 of the first substrate table 12 with respect to the seal member 30.

The upper surface of the cap member C held by the first cap holder CH1, the upper surface of the substrate P held by the substrate holder 13 of the first substrate table 12, and the opposing surface 15 of the first substrate table 12 are substantially flush with one another. Further, the gap formed between the side surface of the substrate P held by the substrate holder 13 and the inner side surface of the recess 12C and the gap formed between the side surface of the cap member C held by the first cap holder CH1 and the inner side surface of the recess 12D are small, which are, for example, about 0.1 to 1 mm. Therefore, the controller 7 can smoothly move the liquid immersion space LS on the first substrate table 12 while suppressing the inflow of the liquid LQ into the inside of the first substrate table 12.

Subsequently, the controller 7 stops the holding of the cap member C having been effected with the first cap holder CH1. Accordingly, the first cap holder CH1 can release the cap member C. The gas bearing 87 is formed between the lower surface of the seal member 30 and the upper surface of the cap member C. The seal member 30 holds the cap member C in the state that the predetermined gap is maintained between the lower surface of the seal member 30 and the upper surface of the cap member C by utilizing the sucking action generated by forming the gas bearing 87 between the seal member 30 and the cap member C.

Figure 5:
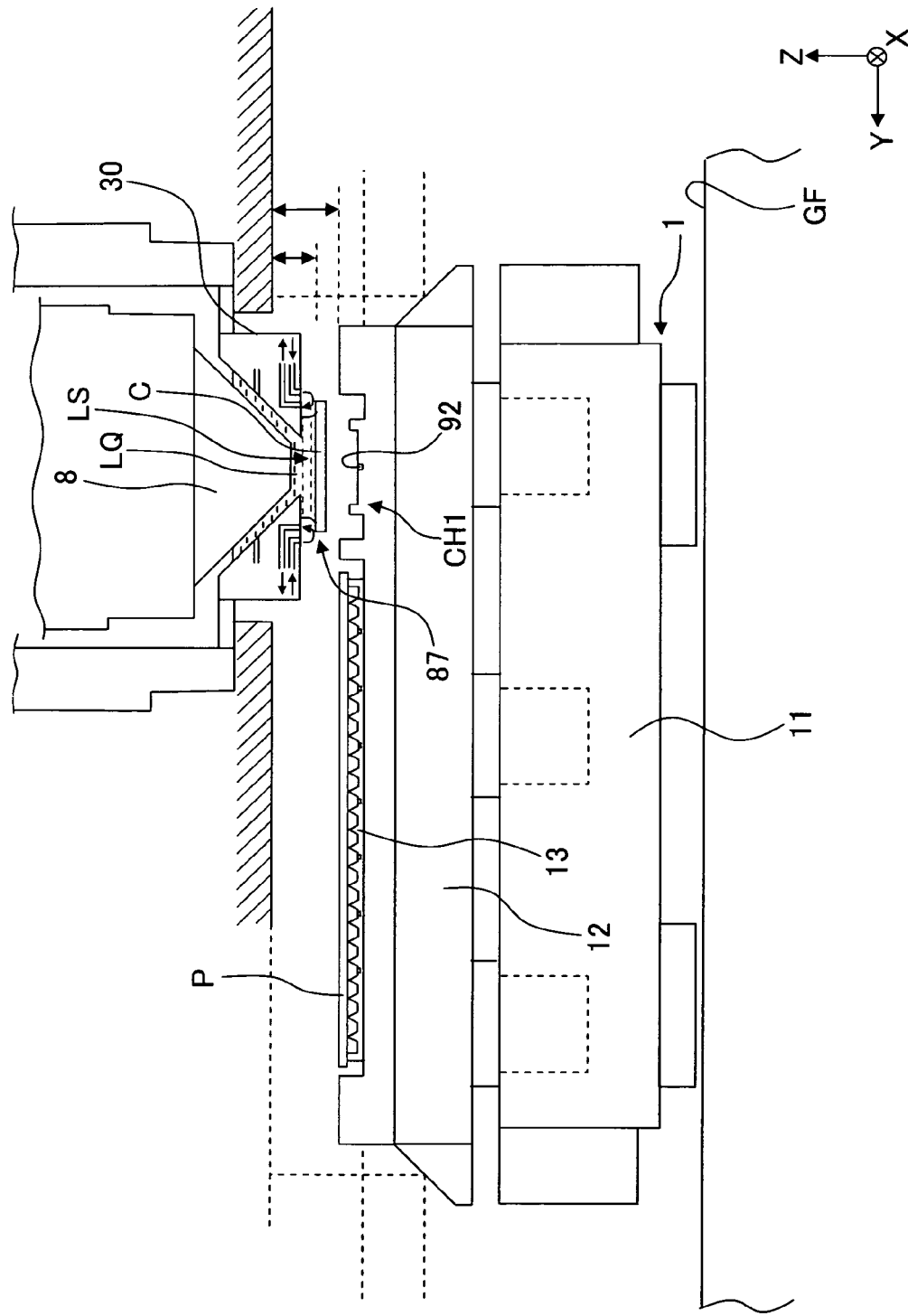
FIG. 5 illustrates an example of the operation of the exposure apparatus according to the first embodiment.

As shown in FIG. 5, the controller 7 controls the fine movement system 5B of the substrate stage-driving system 5 in the state that the gas bearing 87 is formed between the lower surface of the seal member 30 and the upper surface of the cap member C to adjust the positional relationship in the Z axis direction between the cap member C held by the seal member 30 and the first cap holder CH1 of the first substrate table 12 so that the cap member C is detached or removed from the first cap holder CH1. Specifically, the controller 7 controls the fine movement system 5B of the substrate stage-driving system 5 to move the first substrate table 12 in the downward direction (in the –Z direction) so that the lower surface of the cap member C held by the seal member 30 is separated from the upper surface of the first cap holder CH1. By moving the first substrate table 12 in the downward direction (in the –Z direction), the cap member C, which is held by the seal member 30, is removed or detached from the first cap holder CH1 of the first substrate stage 1, and the cap member C is held by the seal member 30. In this way, the cap member C, which has been held by the first cap holder CH1, is released from the first cap holder CH1, and the cap member C is held by the seal member 30.

The seal member 30 holds the upper surface of the cap member C so that the cap member C is arranged at the position opposite to the light exit surface of the first optical element 8 in the state that the gap is maintained between the lower surface of the seal member 30 and the upper surface of the cap member C by utilizing the sucking action effected by the gas bearing 87 formed between the lower surface of the seal member 30 and the upper surface of the cap member C. The cap member C, which is released from the first cap holder CH1 and which is held by the seal member 30, forms a space capable of holding or retaining the liquid LQ between the cap member C and the first optical element 8 and the seal member 30 to hold or retain the liquid LQ between the cap member C and the first optical element 8 and the seal member 30.

When the cap member C, held by the seal member 30, is to be held by the first cap holder CH1, the controller 7 uses the substrate stage-driving system 5 to move the first substrate stage 1 so that the lower surface, of the cap member C, which is on the side opposite to the upper surface of the cap member C making contact with the liquid LQ, is opposite to the first cap holder CH1 provided on the first substrate table 12, while retaining the liquid LQ in the space between the cap member C held by the seal member 30 and the light exit surface of the first optical element 8. When the first cap holder CH1 is to be arranged under or below the cap member C, the controller 7 moves the first substrate stage 1 in the horizontal direction in the state that the first substrate table 12 is lowered by a predetermined distance in the –Z direction with respect to the cap member C held by the seal member 30 such that the seal member 30 or the cap member C held by the seal member 30 does not abut against the first substrate stage 1.

The controller 7 adjusts the positional relationship in the Z axis direction between the cap member C held by the seal member 30 and the first cap holder CH1 of the first substrate table 12 to thereby release the cap member C, which has been held by the seal member 30, from the seal member 30 and the controller makes the cap member C to be transferred to the first cap holder CH1. Specifically, the controller 7 controls the fine movement system 5B of the substrate stage-driving system 5 to move the first substrate table 12 in the upward direction (in the +Z direction) to thereby bring the lower surface of the cap member C held by the seal member 30 into contact with the upper surface of the first cap holder CH1.

In this situation, the position information about the first substrate table 12 is measured by the measuring system 6. The controller 7 controls the substrate stage-driving system 5 based on the measurement result of the measuring system 6 to thereby make it possible to arrange the first cap holder CH1 of the first substrate table 12 at the desired position with respect to the cap member C held by the seal member 30.

After bringing the cap member C held by the seal member 30 into contact with the first cap holder CH1, the controller 7 controls the vacuum system connected to the suction port 92 of the first cap holder CH1 to thereby hold the cap member C with the first cap holder CH1 by suction-attraction. Accordingly, the cap member C, which has been held by the seal member 30, is released from the seal member 30, and the cap member C is held by the first cap holder CH1 of the first substrate table 12. The liquid immersion space LS is formed between the first optical element 8 and the seal member 30 and the cap member C held by the first cap holder CH1. The gas bearing 87 is formed between the lower surface of the seal member 30 and the upper surface of the cap member C. The gap, which is formed between the lower surface of the seal member 30 and the upper surface of the cap member C held by the first cap holder CH1, is maintained.

The controller 7 controls the substrate stage-driving system 5 in the state that the liquid immersion space LS is formed between the first optical element 8 and the seal member 30 and the cap member C held by the first cap holder CH1 to move the first substrate stage 1 in the XY directions with respect to the first optical element 8 and the seal member 30, thereby making the light exit surface of the first optical element 8 and the lower surface of the seal member 30 to face the first substrate stage 1 (including the substrate P). With this, the liquid immersion space LS is formed between the first optical element 8 and the seal member 30 and the first substrate stage 1 (including the substrate P). That is, the liquid LQ, which has been present in the space between the first optical element 8 and the cap member C, is moved to the space between the first optical element 8 and the substrate P in accordance with the movement of the first substrate stage 1. The gas bearing 87 is formed between the lower surface of the seal member 30 and the first substrate stage 1. After moving the liquid LQ to the space between the first optical element 8 and the substrate P, the controller 7 exposes the substrate P via the liquid LQ and the first optical element 8 in the first area SP1.

The explanation has been made above about the operation for releasing the cap member C having been held by the first cap holder CH1 from the first cap holder CH1 and making the cap member C to be held by the seal member 30 and the operation for releasing the cap member C having been held by the seal member 30 from the seal member 30 and making the cap member C to be held by the first cap holder CH1. Since an operation for releasing the cap member C having been held by the second cap holder CH2 from the second cap holder CH2 and making the cap member C to be held by the seal member 30 and an operation for releasing the cap member C having been held by the seal member 30 from the seal member 30 and making the cap member C to be held by the second cap holder CH2 are also same as the operation for releasing the cap member C having been held by the first cap holder CH1 from the first cap holder CH1 and making the cap member C to be held by the seal member 30 and the operation for releasing the cap member C having been held by the seal member 30 from the seal member 30 and making the cap member C to be held by the first cap holder CH1, any explanation thereof is omitted. In this embodiment, in an operation for exposing a plurality of pieces of the substrate P in a same lot, the cap member C is transferred from the seal member 30 alternately with respect to the first and second cap holders CH1 and CH2. For example, after completing the exposure for a substrate P held to the first substrate stage 1, the cap member C is released from the first cap holder CH1 and is held by the seal member 30. Next, prior to the exposure for a substrate P held to the second substrate stage 2, the cap member C is released from the seal member 30 and is held by the second cap holder CH2. Then, after the completion of the exposure for the substrate P held to the second substrate stage 2, the cap member C is released from the second cap holder CH2 and is held by the seal member 30. Next, prior to the exposure for a substrate P held to the first substrate stage 1, the cap member C is released from the seal member 30 and is held by the first cap holder CH1. Thereafter, the above operations are repeated until the exposure for all the substrates in the lot is completed.

Figure 6:
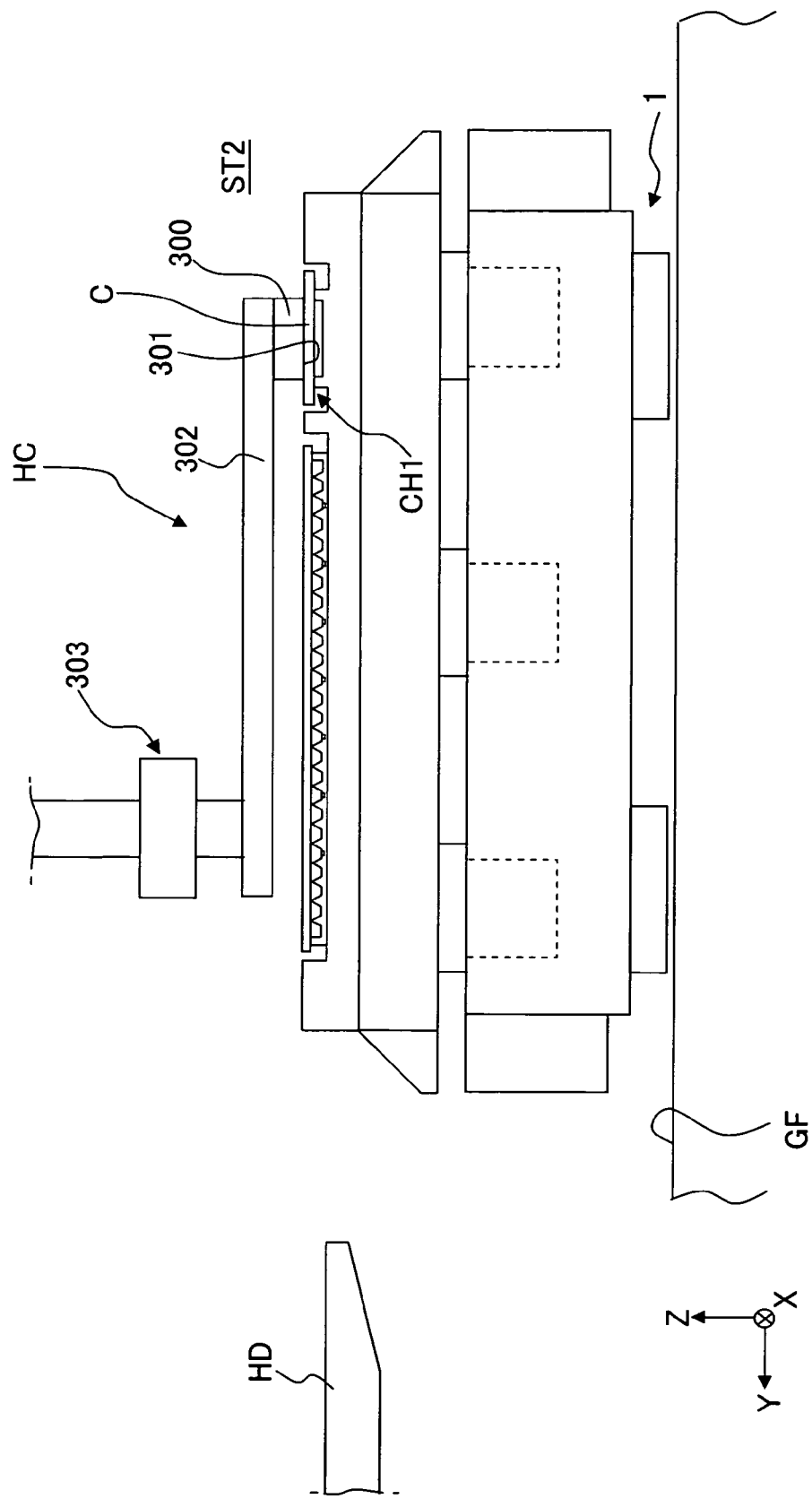
FIG. 6 shows an example of a cap member transport system according to the first embodiment.
Figure 7:
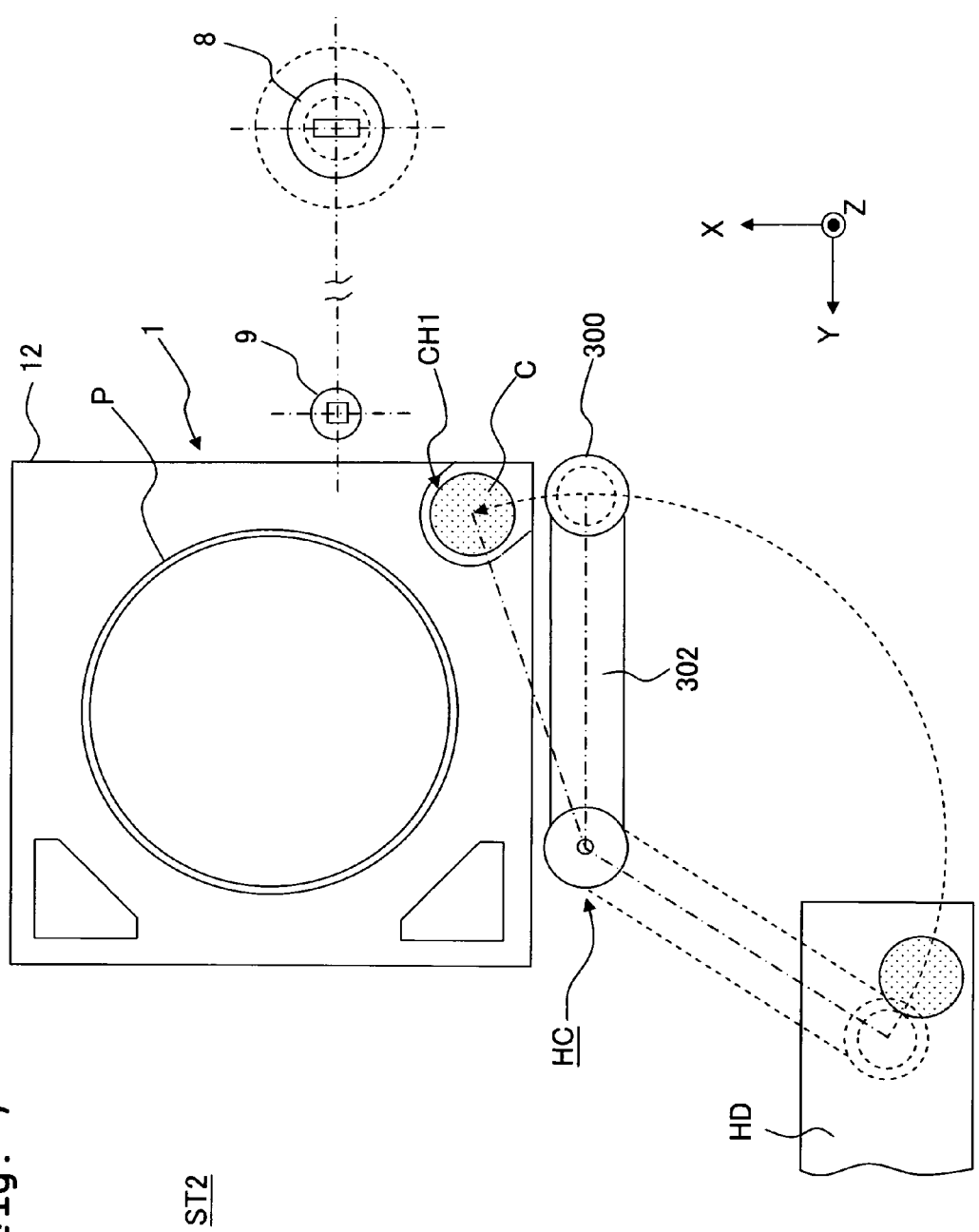
FIG. 7 illustrates an example of the operation of the cap member transport system.
Figure 8:
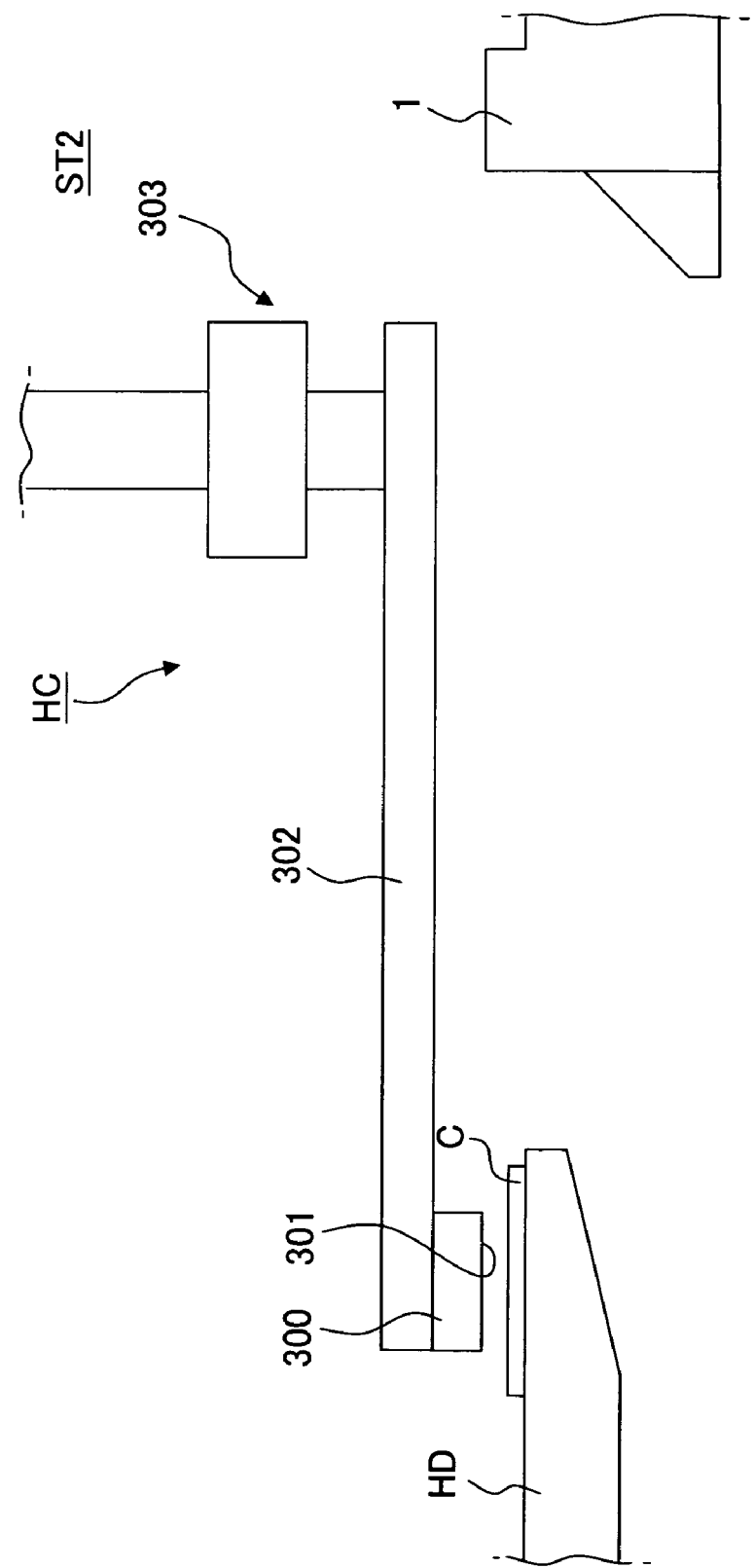
FIG. 8 illustrates an example of the operation of the cap member transport system.

Next, the cap member transport system HC will be explained with reference to FIGS. 6 to 8. FIG. 6 is a side view of the cap member transport system HC. FIG. 7 is a plan view of the cap member transport system HC. FIG. 8 shows the operation of the cap member transport system HC.

The cap member C which is released from the seal member 30, the first cap holder CH1, and the second cap holder CH2 is transported to a predetermined position by the cap member transport system HC. In this embodiment, the cap member transport system HC is arranged in the measuring station ST2 including the second area SP2. The cap member transport system HC may be arranged in the exposure station ST1 including the first area SP1 as in a modification described later on.

The exposure apparatus EX of this embodiment is provided with a placing stand HD which is constructed to be accessible by an external apparatus and which has a placing surface capable of placing the cap member C thereon. In this embodiment, the placing stand HD is arranged in the measuring station ST2. The cap member transport system HC is capable of transporting the cap member C to the placing stand HD. When the cap member transport system HC is placed or arranged in the exposure station ST1, the placing stand HD also may be arranged in the exposure station ST1.

The cap member transport system HC transports, to the placing stand HD, the cap member C released from the first cap holder CH1 of the first substrate stage 1 moved to the second area SP2 of the measuring station ST2 or from the second cap holder CH2 of the second substrate stage 2 moved to the second area SP2 of the measuring station ST2.

The cap member transport system HC includes a holding mechanism 300 which has a holding surface 301 capable of holding the cap member C, a support member 302 which supports the holding mechanism 300, and a driving mechanism 303 which is capable of moving the support member 302 supporting the holding mechanism 300 to thereby move the holding mechanism 300. The operation of the cap member transport system HC is controlled by the controller 7. The cap member transport system HC is capable of transporting the cap member C to the desired position by holding the cap member C with the holding mechanism 300 and moving the holding mechanism 300 holding the cap member C, with the driving mechanism 300 via the support member 302.

In this embodiment, the holding surface 301 of the holding mechanism 300 is directed in the downward direction (in the −Z direction), and is capable of holding the upper surface of the cap member C. The holding mechanism 300 includes, for example, a vacuum chuck mechanism, and is capable of holding the upper surface of the cap member C by suction-attraction. The controller 7 can separate the cap member C from the holding surface 301 of the holding mechanism 300 by releasing or stopping the holding operation (sucking operation) performed by the holding mechanism 300. In this way, the holding mechanism 300 releasably holds the cap member C.

The support member 302 is, for example, a rod-shaped (arm-shaped) member, supporting the holding mechanism 300 by one end (end portion) of the support member 302, and being connected to the driving mechanism 303 at the other end of the support member 302. The driving mechanism 303 supports the support member 302 so that the support member 302 and the XY plane are substantially parallel to each other.

The driving mechanism 303 includes an actuator such as a rotary motor, and is capable of rotating the other end of the support member 302 in the θZ direction.

The driving mechanism 303 is capable of swinging the holding mechanism 300 supported by one end of the support member 302 in the θZ direction by rotating the other end of the support member 302 in the θZ direction. In this embodiment, the driving mechanism 303 is capable of moving (finely moving) the support member 302 not only in the θZ direction but also in the X axis, Y axis, Z axis, θX, and θY directions. That is, the driving mechanism 303 is capable of swinging the holding mechanism 300 supported by one end of the support member 302 in the θZ direction, and the driving mechanism 303 is capable of moving (finely moving) the holding mechanism 300 in the X axis, Y axis, Z axis, θX, and θY directions.

Next, an explanation will be made about an example of the operation of the cap member transport system HC. For example, when the cap member C held by the first cap holder CH1 of the first substrate stage 1 is transported by the cap member transport system HC, the controller 7 uses the substrate stage-driving system 5 to move the first substrate stage 1 to the second area SP2 of the measuring station ST2 as shown in FIG. 6. The controller 7 controls at least one of the cap member transport system HC and the substrate stage-driving system 5 to make the holding surface 301 of the holding mechanism 300 to be opposite to or face the upper surface of the cap member C held by the first cap holder CH1.

Subsequently, the controller 7 controls at least one of the driving mechanism 303 of the cap member transport system HC and the substrate stage-driving system 5 to adjust the positional relationship in the Z axis direction between the holding surface 301 of the holding mechanism 300 and the upper surface of the cap member C held by the first cap holder CH1, thereby bringing the holding surface 301 of the holding mechanism 300 into contact with the upper surface of the cap member C held by the first cap holder CH1.

Subsequently, the controller 7 stops or releases the holding of the cap member C having been effected by the first cap holder CH1. With this, the first cap holder CH1 can release the cap member C. The controller 7 drives the holding mechanism 300 to hold the upper surface of the cap member C so that the upper surface of the cap member C is attracted and held by the holding surface 301 of the holding mechanism 300.

The controller 7 controls at least one of the driving mechanism 303 of the cap member transport system HC and the substrate stage-driving system 5 in the state that the upper surface of the cap member C is held by the holding surface 301 of the holding mechanism 300 to adjust the positional relationship in the Z axis direction between the cap member C held by the holding mechanism 300 and the first cap holder CH1 of the first substrate table 12, thereby removing or detaching the cap member C from the first cap holder CH1. Specifically, the controller 7 controls the fine movement system 5B of the substrate stage-driving system 5 to move the first substrate table 12 in the downward direction (in the −Z direction) and/or the controller 7 controls the driving mechanism 303 of the cap member transport system HC to move the holding mechanism 300 in the upward direction (in the +Z direction) so as to separate the lower surface of the cap member C, held by the holding mechanism 300, from the upper surface of the first cap holder CH1. Accordingly, the cap member C, which has been held by the first cap holder CH1, is released from the first cap holder CH1, and the cap member C is held by the holding mechanism 300.

The controller 7 controls the driving mechanism 303 in the state that the cap member C is held by the holding mechanism 300 to swing the holding mechanism 300 holding the cap member C in the θZ direction. The placing stand HD is arranged at the predetermined position in the measuring station ST2; and as shown in FIG. 7, the controller 7 transports, to the placing stand HD, the cap member C held by the holding mechanism 300, by swinging the holding mechanism 300 holding the cap member C.

The controller 7 stops or releases the holding operation having been effected for the cap member C by the holding mechanism 300 in the state that the cap member C held by the holding mechanism 300 is opposite to or faces the placing surface of the placing stand HD. With this, as shown in FIG. 8, the cap member C is placed on the placing stand HD. As described above, the cap member transport system HC can transport, to the placing stand HD, the cap member C released from the first cap holder CH1 of the first substrate stage 1 moved to the second area SP2 of the measuring station ST2.

The cap member transport system HC is capable of transporting the cap member C placed on the placing stand HD to the first cap holder CH1 of the first substrate stage 1 disposed in the second area SP2 of the measuring station ST2. When the controller 7 transports the cap member C placed on the placing stand HD to the first cap holder CH1 of the first substrate stage 1 by using the cap member transport system HC, the controller 7 uses the substrate stage-driving system 5 to move the first substrate stage 1 to the second area SP2 of the measuring station ST2. Further, the controller 7 holds the upper surface of the cap member C placed on the placing stand HD with the holding mechanism 300 of the cap member transport system HC. In the state that the cap member C is held by the holding mechanism 300, the controller 7 controls the driving mechanism 303 to swing the holding mechanism 300 holding the cap member C in the θZ direction. The first substrate stage 1 is arranged in the measuring station ST2; and the controller 7 swings the holding mechanism 300 holding the cap member C to thereby make the lower surface of the cap member C held by the holding mechanism 300 to be opposite to or to face the upper surface of the first cap holder CH1 of the first substrate stage 1.

The controller 7 adjusts the positional relationship in the Z axis direction between the cap member C held by the holding mechanism 300 and the first cap holder CH1 of the first substrate table 12 in the state that the lower surface of the cap member C held by the holding mechanism 300 is opposite to or faces the upper surface of the first cap holder CH1 so that the cap member C, held by the holding mechanism 300, is transferred to the first cap holder CH1. Specifically, the controller 7 controls the fine movement system 5B of the substrate stage-driving system 5 to move the first substrate table 12 in the upward direction (in the +Z direction), and/or the controller 7 controls the driving mechanism 303 of the cap member transport system HC to move the holding mechanism 300 in the downward direction (in the −Z direction), to thereby bring the lower surface of the cap member C held by the holding mechanism 300 into contact with the upper surface of the first cap holder CH1.

After the controller 7 brings the cap member C held by the holding mechanism 300 into contact with the first cap holder CH1, the controller 7 controls the vacuum system connected to the suction port 92 of the first cap holder CH1 to hold the cap member C with the first cap holder CH1 by suction-attraction. Further, the controller 7 stops or releases the sucking operation for the cap member C by the holding mechanism 300. Accordingly, the cap member C, which has been held by the holding mechanism 300, is released from the holding mechanism 300, and the cap member C is held by the first cap holder CH1 of the first substrate table 12.

As described above, in this embodiment, the cap member transport system HC is capable of transporting the cap member C released from the first cap holder CH1 to the placing stand HD arranged at the predetermined position. Further, the cap member transport system HC is capable of transporting the cap member C placed on the placing stand HD to the first cap holder CH1.

Similarly, the cap member transport system HC is capable of transporting the cap member C released from the second cap holder CH2 of the second substrate table 22 to the placing stand HD arranged at the predetermined position. Further, the cap member transport system HC is capable of transporting the cap member C placed on the placing stand HD to the second cap holder CH2 of the second substrate table 22. When the cap member C is transported between the second cap holder CH2 and the placing stand HD by using the cap member transport system HC, the second substrate stage 2 is moved to the second area SP2 of the measuring station ST2.

Next, an explanation will be made with reference to plan views shown in FIGS. 9 to 14 about an example of the method for exposing the substrate P by using the exposure apparatus EX constructed as described above, especially about the sequence using the cap member C.

Figure 9:
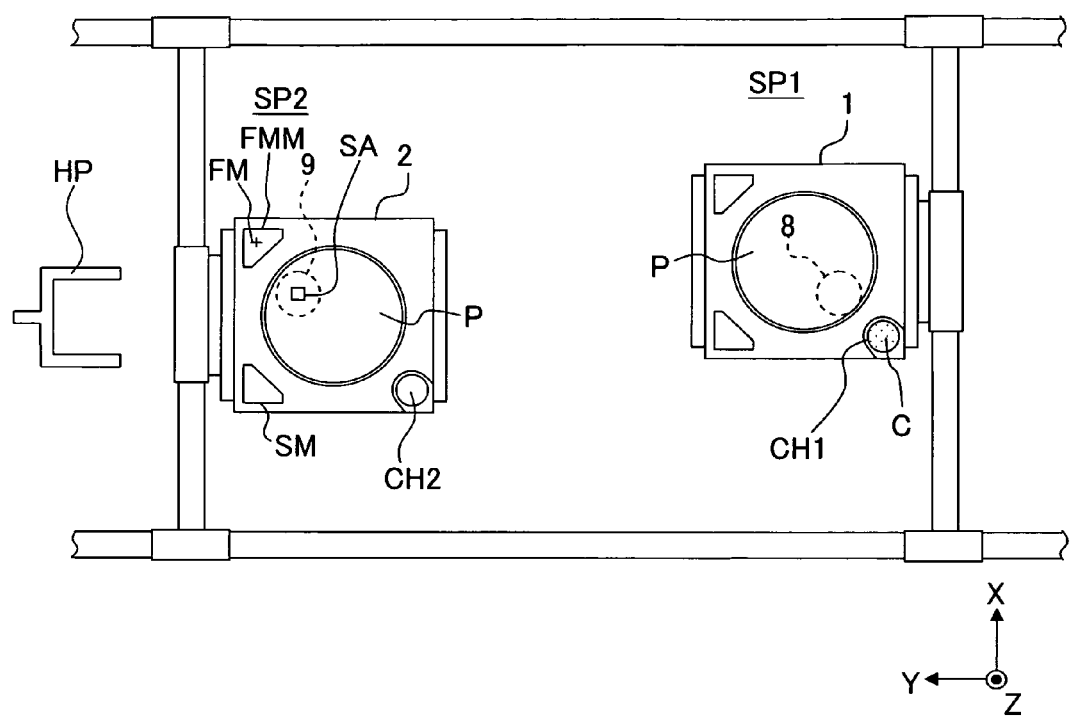
FIG. 9 illustrates an exposure method according to the first embodiment.
Figure 10:
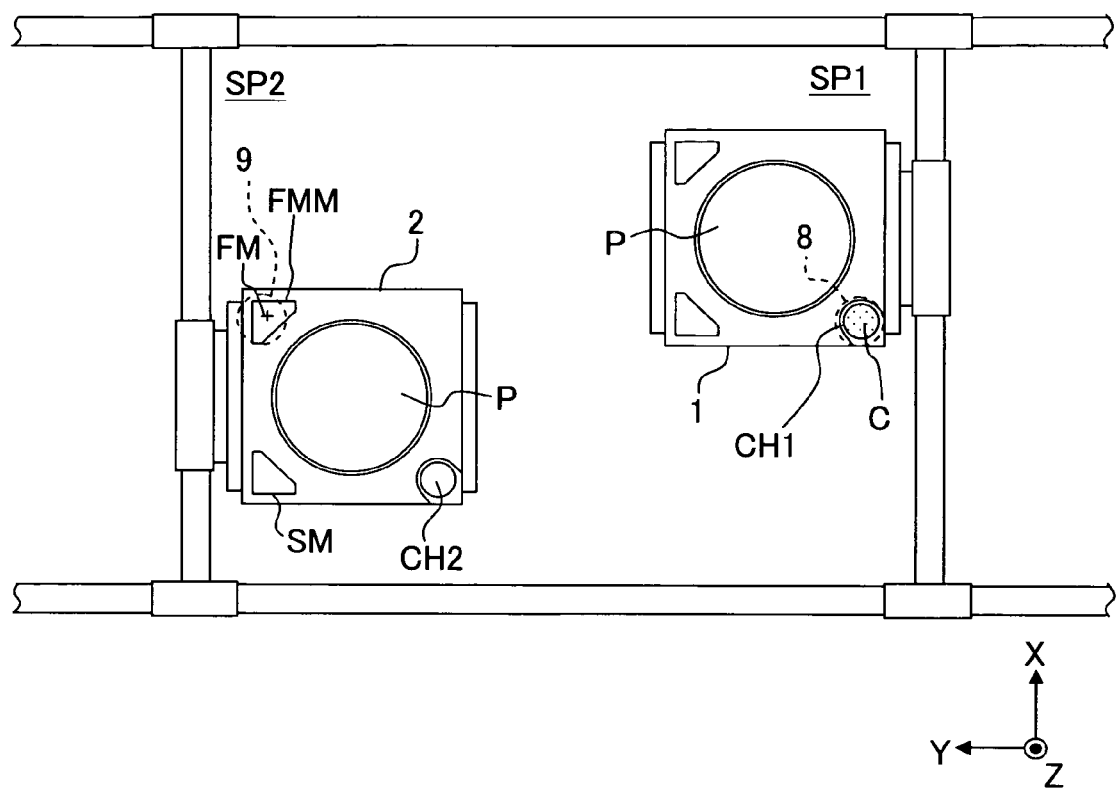
FIG. 10 illustrates the exposure method according to the first embodiment.

As shown in FIG. 9, the liquid immersion exposure is performed for a substrate P held by the first substrate stage 1 in the first area SP1 of the exposure station ST1; and the substrate exchange operation for the second substrate stage 2, the measurement process for another substrate P held to the second substrate stage 2, and the like are performed in the measuring station ST2. The measurement process includes the measurement process using the alignment system AL described above and the measurement process using the focus/leveling-detecting system FL. In the measurement process using the alignment system AL, the detection of the position information about the alignment mark in a shot area SA on the substrate P as shown in FIG. 9, and the detection of the reference mark FM as shown in FIG. 10 are performed. The controller 7 determines the position information about each of the plurality of shot areas on the substrate P with respect to the predetermined reference position (for example, positional relationship between the reference mark FM and each of the plurality of shot areas on the substrate P) by the calculating process based on the measured position information about the shot areas.

The controller 7 uses the seal member 30 to form the liquid immersion space LS between the first optical element 8 and the substrate P held by the first substrate stage 1 and exposes, in the step-and-scan manner, a plurality of shot areas on the substrate P through the liquid LQ in the liquid immersion space LS. As shown in FIG. 9, the first cap holder CH1 of the first substrate stage 1 holds the cap member C during the exposure for the substrate P held by the substrate holder 13 of the first substrate stage 1.

As shown in FIG. 10, after the liquid immersion exposure is completed for the substrate P on the first substrate stage 1, the controller 7 controls the substrate stage-driving system 5 to move the first substrate stage 1 in the XY directions so that the state that the light exit surface of the first optical element 8 is opposite to the surface of the substrate P held by the substrate holder 13 of the first substrate stage 1, is changed to a state that the light exit surface of the first optical element 8 is opposite to the upper surface of the cap member C held by the first cap holder CH1 of the first substrate stage 1. Accordingly, the liquid immersion space LS is formed between the light exit surface of the first optical element 8 and the upper surface of the cap member C held by the first cap holder CH1.

Subsequently, the controller 7 stops the holding of the cap member C having been effected by the first cap holder CH1 to thereby release the cap member C from the first cap holder CH1, and the controller 7 utilizes the sucking-attracting action of the gas bearing 87 to hold the cap member C with the seal member 30. The cap member C, which is held by the seal member 30, is arranged at the position opposite to the light exit surface of the first optical element 8.

Figure 11:
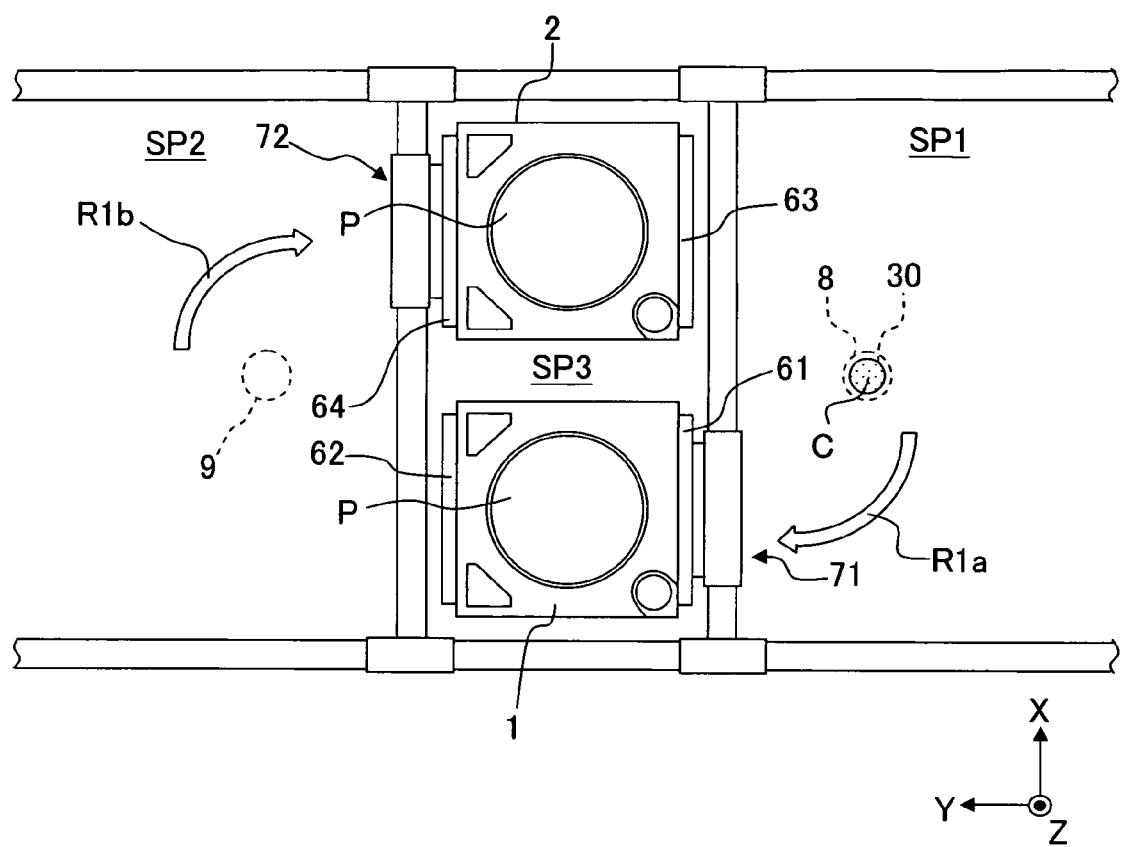
FIG. 11 illustrates the exposure method according to the first embodiment.

After moving the opposing surface 15 of the first substrate table 12 to a position lower than (in the −Z direction with respect to) the lower surface of the cap member C in the state that the cap member C is held by the seal member 30, the controller 7 moves the first substrate stage 1 from the first area SP1 to the third area SP3 as shown in FIG. 11.

When both of the first substrate stage 1 and the second substrate stage 2 are away or apart from the first area SP1 including the first position opposite to the light exit surface of the first optical element 8 as described above, then the seal member 30 holds the cap member C.

The cap member C held by the seal member 30 can retain the liquid LQ between the cap member C and the first optical element 8; and the liquid immersion space LS is formed between the first optical element 8 and the cap member C held by the seal member 30.

The controller 7 controls the substrate stage-driving system 5 to move each of the first substrate stage 1 and the second substrate stage 2 to the third area SP3 as shown in FIG. 11, while using the measuring system 6 to measure the positions of the first and second substrate stages 1, 2. In this embodiment, the first substrate stage 1 moved from the first area SP1 to the third area SP3 is arranged in an area which is included in the third area SP3 and which is on the −X side as shown in the drawing; and the second substrate stage 2 moved from the second area SP2 to the third area SP3 is arranged in an area which is included in the third area SP3 and which is on the +X side as shown in the drawing. When the first substrate stage 1 is moved from the first area SP1 to the third area SP3, the first substrate stage 1 is moved along a route indicated by an arrow R1a in FIG. 11; and when the second substrate stage 2 is moved from the second area SP2 to the third area SP3, the second substrate stage 2 is moved along a route indicated by an arrow R1b in FIG. 11.

Figure 12:
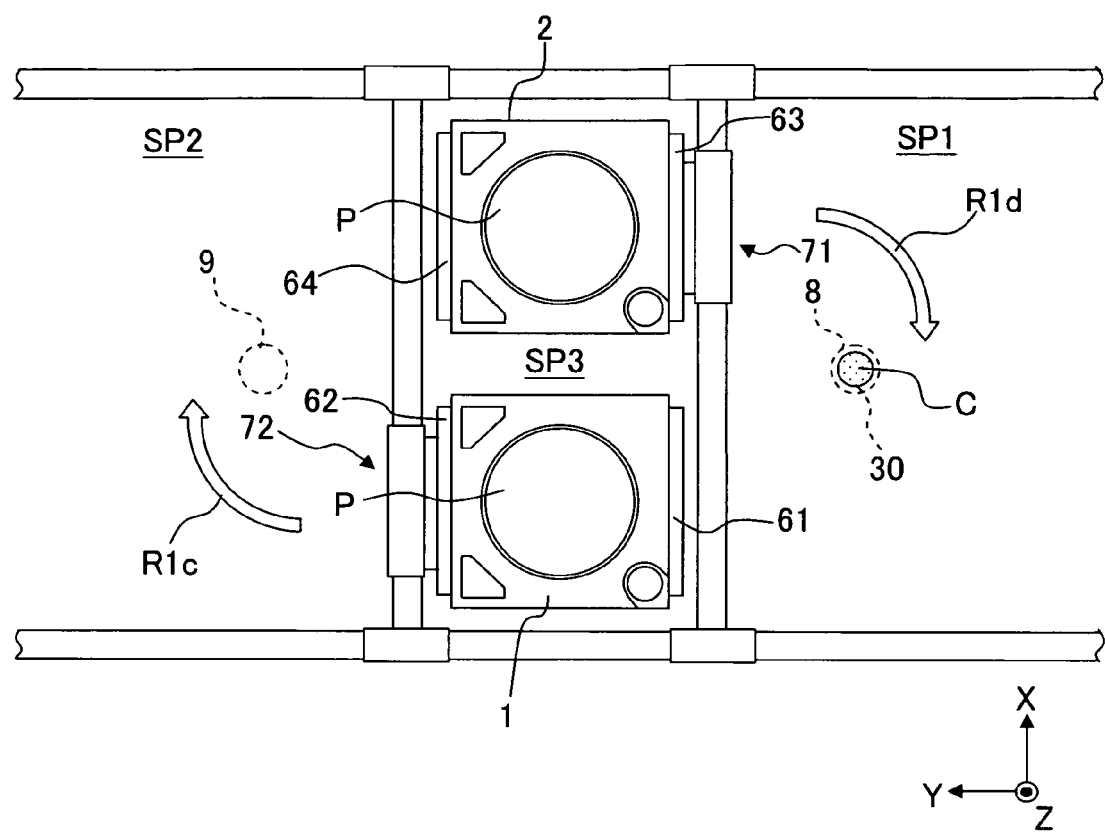
FIG. 12 illustrates the exposure method according to the first embodiment.

Subsequently, as shown in FIG. 12, the controller 7 executes the release of the connection between the first connecting member 71 and the first joint member 61 of the first substrate stage 1 and the release of the connection between the second connecting member 72 and the fourth joint member 64 of the second substrate stage 2 in the third area SP3; and the controller 7 executes the connection between the first connecting member 71 and the third joint member 63 of the second substrate stage 2 and the connection between the second connecting member 72 and the second joint member 62 of the first substrate stage 1 in the third area SP3. In this way, the controller 7 executes the exchange operation for the first connecting member 71 and the second connecting member 72 with respect to the first substrate stage 1 and the second substrate stage 2 in the third area SP3.

Subsequently, the controller 7 controls the substrate stage-driving system 5 to move the second substrate stage 2 to the first area SP1 of the exposure station ST1, and to move the first substrate stage 1 to the second area SP2 of the measuring station ST2. When the first substrate stage 1 is moved from the third area SP3 to the second area SP2, the first substrate stage 1 is moved along a route indicated by an arrow R1c in FIG. 12; and when the second substrate stage 2 is moved from the third area SP3 to the first area SP1, the second substrate stage 2 is moved along a route indicated by an arrow R1d in FIG. 12.

Figure 13:
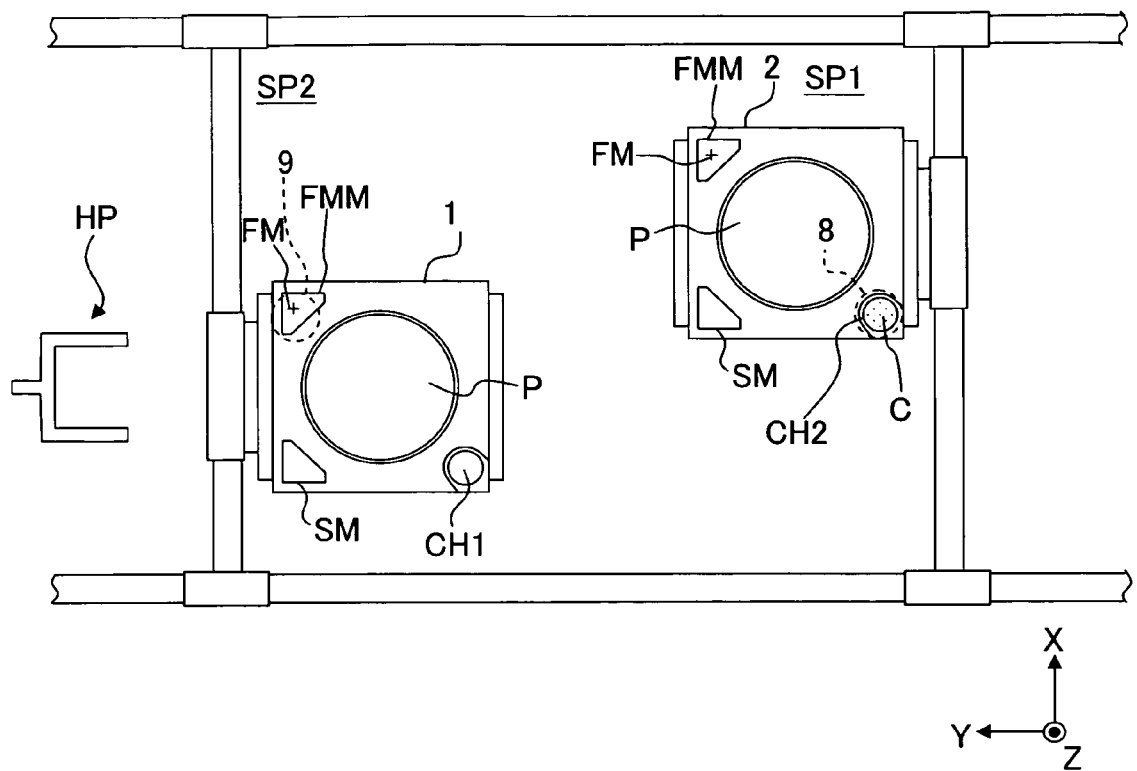
FIG. 13 illustrates the exposure method according to the first embodiment.

As shown in FIG. 13, the controller 7 roves the second substrate stage 2 so that the cap member C held by the seal member 30 faces or is opposite to the second cap holder CH2 of the second substrate stage 2. Subsequently, the controller 7 releases, from the seal member 30, the cap member C having been held by the seal member 30 and to makes the cap member C to be held by the second cap holder CH2. In the second area SP2 of the measuring station ST2, the exchange of a substrate P on the first substrate stage 1 is performed, and the measurement process for a substrate P placed on the first substrate P is performed (for example, the alignment mark of the substrate P and the reference mark FM is detected, etc).

Figure 14:
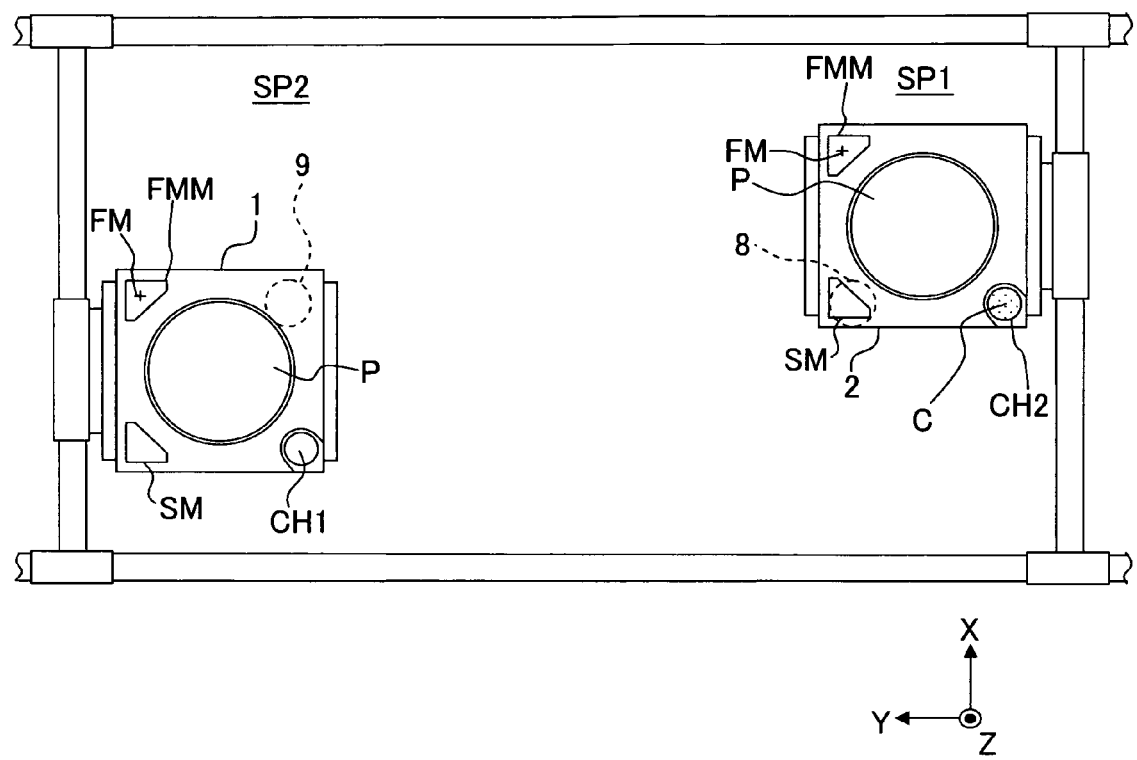
FIG. 14 illustrates the exposure method according to the first embodiment.

Then, as shown in FIG. 14, after the cap member C is held by the second cap holder CH2, the controller 7 controls the substrate stage-driving system 5 to move the second substrate stage 2 in the XY directions so that the state that the light exit surface of the first optical element 8 faces or is opposite to the upper surface of the cap member C held by the second cap holder CH2 of the second substrate stage 2, is changed to a state that the light exit surface of the first optical element 8 is opposite to the opposing surface 25 of the second substrate stage 2 (the surface of the substrate P held by the substrate holder 23 of the second substrate stage 2 thereafter). Accordingly, the liquid immersion space LS is formed between the light exit surface of the first optical element 8 and the opposing surface 25 of the second substrate stage 2 (the surface of the substrate F held by the substrate holder 23 of the second substrate stage 2 thereafter). When the second substrate stage 2 is moved to make the liquid immersion space LS arrive at a position on the measuring member SM as shown in FIG. 14, then, for example, intensity of the exposure light EL etc. is detected by a detecting system such as an optical sensor installed under or below the measurement member SM. Further, the liquid immersion space LS is moved to the position on the reference member FMM, and the reference mark FM and the mark of the mask is detected by the above-described mask alignment system. The controller 7 controls the position of the second substrate stage 2 based on the detection result of the above-described alignment system AL and the detection result of the mask alignment system.

The controller 7 controls the substrate stage-driving system 5 to move the second substrate stage 2 in the XY directions so that the change is made to provide a state that the light exit surface of the first optical element 8 is opposite to or faces the surface of the substrate P held by the substrate holder 23 of the second substrate stage 2. By doing so, the first shot area on the substrate P is moved to an exposure start position. The liquid immersion exposure is performed for the substrate P held by the second substrate stage 2 in the first area SP1 of the exposure station ST1; and the substrate exchange operation for the first substrate stage 1, the measurement process for the substrate P held by the first substrate stage 1, and the like are performed in the measuring station ST2. The second cap holder CH2 of the second substrate stage 2 holds the cap member C during the exposure for the substrate P held by the substrate holder 23 of the second substrate stage 2.

Afterwards, the same process is repeated. That is, after completing the liquid immersion exposure for the substrate P on the second substrate stage 2, the controller 7 releases the cap member C from the second cap holder CH2, and holds the cap member C with the seal member 30. The cap member C held by the seal member 30 retains the liquid LQ between the cap member C and the first optical element 8.

Subsequently, the controller 7 controls the substrate stage-driving system 5 to move, to the third areas SP3, each of the first substrate stage 1 holding the substrate P for which the measurement process has been completed and the second substrate stage 2 holding the substrate P for which the exposure process has been completed. In the third space SP3, the controller 7 executes the exchange operation for the first connecting member 71 and the second connecting member 72 with respect to the first substrate stage 1 and the second substrate stage 2.

Subsequently, the controller 7 controls the substrate stage-driving system 5 to move the first substrate stage 1 to the first area SP1 of the exposure station ST1, and to move the second substrate stage 2 to the second area SP2 of the measuring station ST2. Afterwards, the controller 7 releases, from the seal member 30, the cap member C having been held by the seal member 30 and holds the cap member C with the first cap holder CH1 of the first substrate stage 1 moved to the first area SP1. Then, the controller 7 executes the liquid immersion exposure for the substrate P held by the substrate holder 13 of the first substrate table 12 in the state that the cap member C is held by the first cap holder CH1 of the first substrate table 12. The controller 7 executes the measurement process and the substrate exchange operation using the second substrate stage 2 arranged in the measuring station ST2 concurrently with at least a part of the process using the first substrate stage 1 arranged in the exposure station ST1. In this embodiment, prior to liquid immersion exposure for a substrate P held by one of the first and second substrate stages 1 and 2 moved to the first area SP of the exposure station SP1, the measurement process is executed by using the measuring member SM and the reference member FMM of one of the first and second substrate stages 1 and 2. However, it is allowable to perform only the measurement process using the reference member FMM, without performing the measurement process using the measuring member SM. Further, in this embodiment, the mark of the mask and the reference mark FM are detected by the above-described mask alignment system. However, it is allowable to use, for example, the measuring member SM to detect the mark of the mask.

There is a possibility that the cap member C may be deteriorated and/or polluted. If the cap member C is continuously used while leaving the state that the cap member C is deteriorated and/or polluted as it is, then there is a possibility that the following inconvenience or problem might arise such that the liquid LQ retained between the cap member C and the light exit surface of the first optical element 8 of the projection optical system PL might leak, that the light exit surface of the first optical element 8 of the projection optical system PL might be polluted, and/or the like. If such an inconvenience or problem arises, there is a possibility for example that the exposure accuracy might be deteriorated. Further, due to the leakage of the liquid LQ, the pollution of, for example, the first optical element 8 of the projection optical system PL, and/or the like, if the maintenance operation is required to be frequently performed, then there is a possibility that the rate of operation of the exposure apparatus EX might be lowered. In view of the above, in this embodiment, the operation for transporting the cap member C to the placing stand HD at the predetermined timing is executed by using the cap member transport system HC, and the process is executed for the cap member C transported to the placing stand HD in order to suppress the deterioration of the exposure accuracy.

An explanation will be made below with reference to plan views shown in FIGS. 15 to 18 about the sequence for transporting the cap member C to the placing stand HD.

Figure 15:
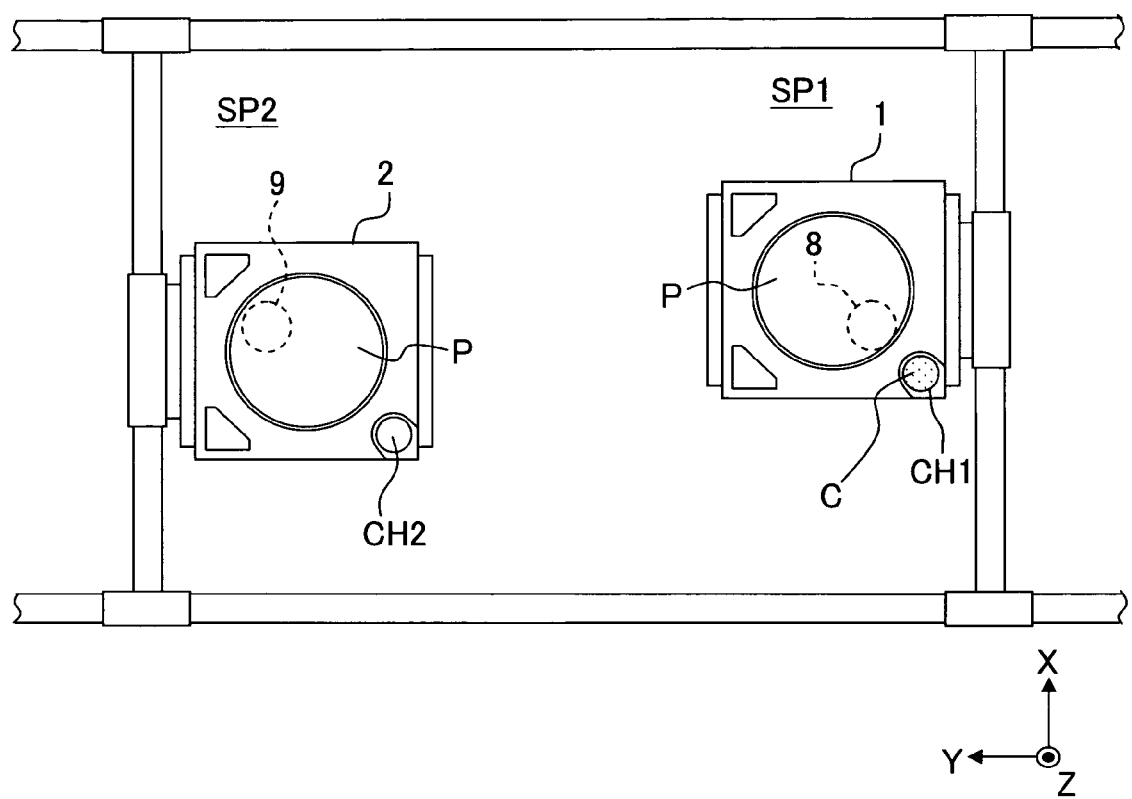
FIG. 15 illustrates the exposure method according to the first embodiment.

FIG. 15 shows the state that the substrate P held by the substrate holder 13 of the first substrate stage 1 is subjected to the liquid immersion exposure in such a state that the cap member C is held by the first cap holder CH1 of the first substrate stage 1. In this embodiment, the explanation will be made as exemplified by a case in which the cap member C held by the first cap holder CH1 is transported to the placing stand HD after the completion of the liquid immersion exposure for the substrate P on the first substrate stage 1. In FIG. 15, the cap member C held by the first cap holder CH1 of the first substrate stage 1 is released from the seal member 30 before the exposure for the substrate P held by the first substrate stage 1, and the cap member C is held by the first cap holder CH1.

Figure 16:
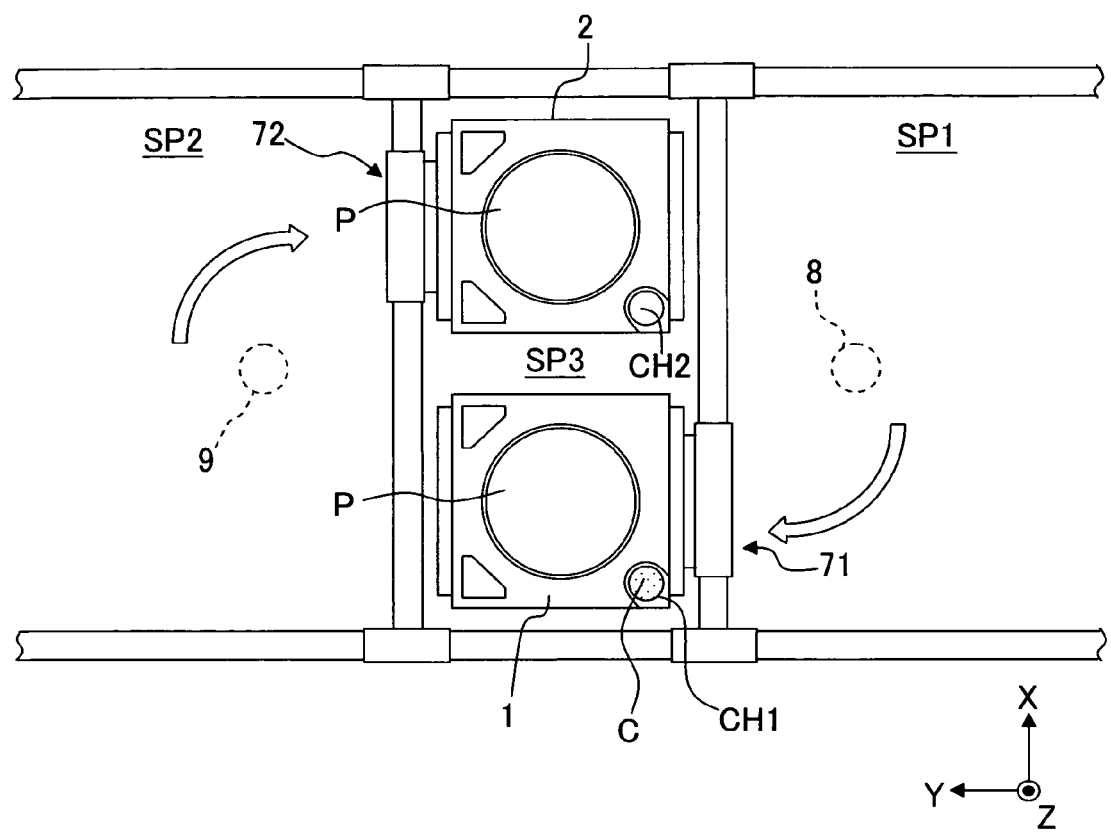
FIG. 16 illustrates the exposure method according to the first embodiment.

After completing the liquid immersion exposure for the substrate P on the first substrate stage 1, the controller 7 stops the supply operation for supplying the liquid LQ using the seal member 30, and recovers all of the liquid LQ in the liquid immersion space LS. After that, as shown in FIG. 16, the controller 7 moves, to the third area SP3, the first substrate stage 1 which has the first cap holder CH1 holding the cap member C, without releasing the cap member C held by the first cap holder CH1. That is, the first substrate stage 1 is moved to the third area SP3 while holding the cap member C by the first cap holder CH1 without delivering the cap member C held with the first cap holder CH1 to the seal member 30. In this situation, the substrate P is also held by the first substrate stage 1.

Figure 17:
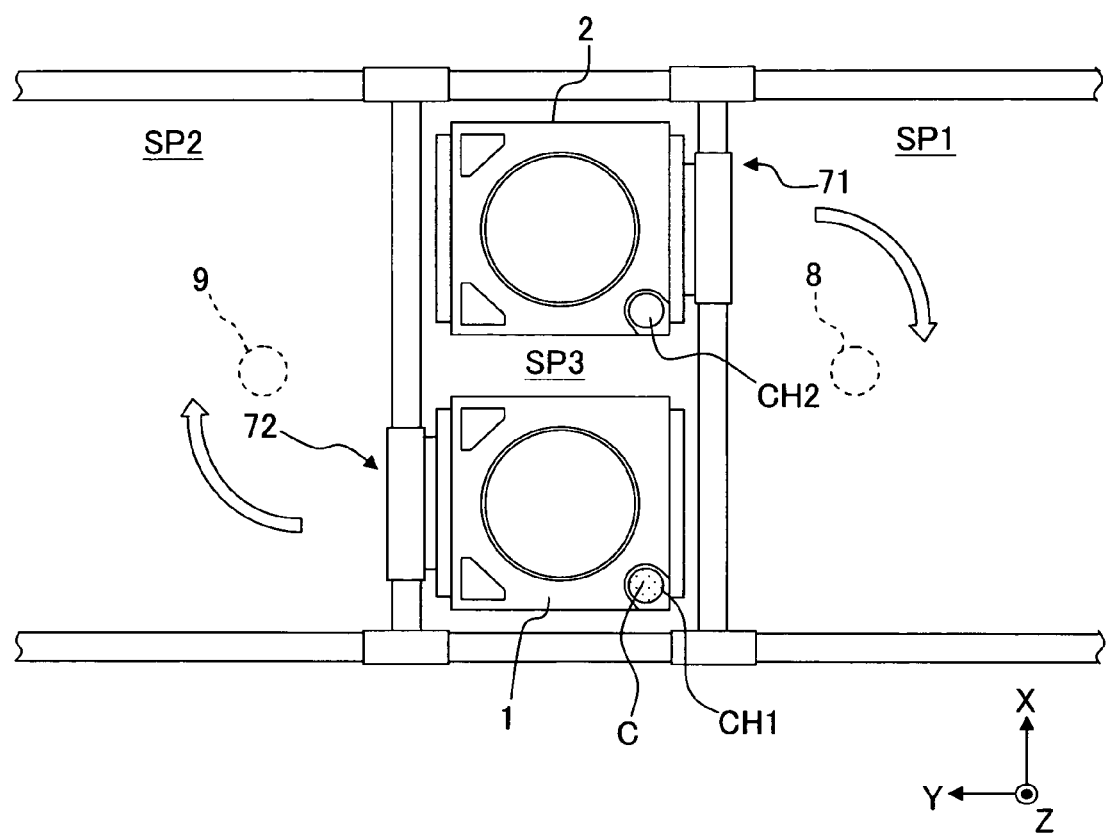
FIG. 17 illustrates the exposure method according to the first embodiment.

Subsequently, as shown in FIG. 17, the controller 7 executes the exchange operation for the first connecting member 71 and the second connecting member 72 with respect to the first substrate stage 1 and the second substrate stage 2 in the third area SP3.

Figure 18:
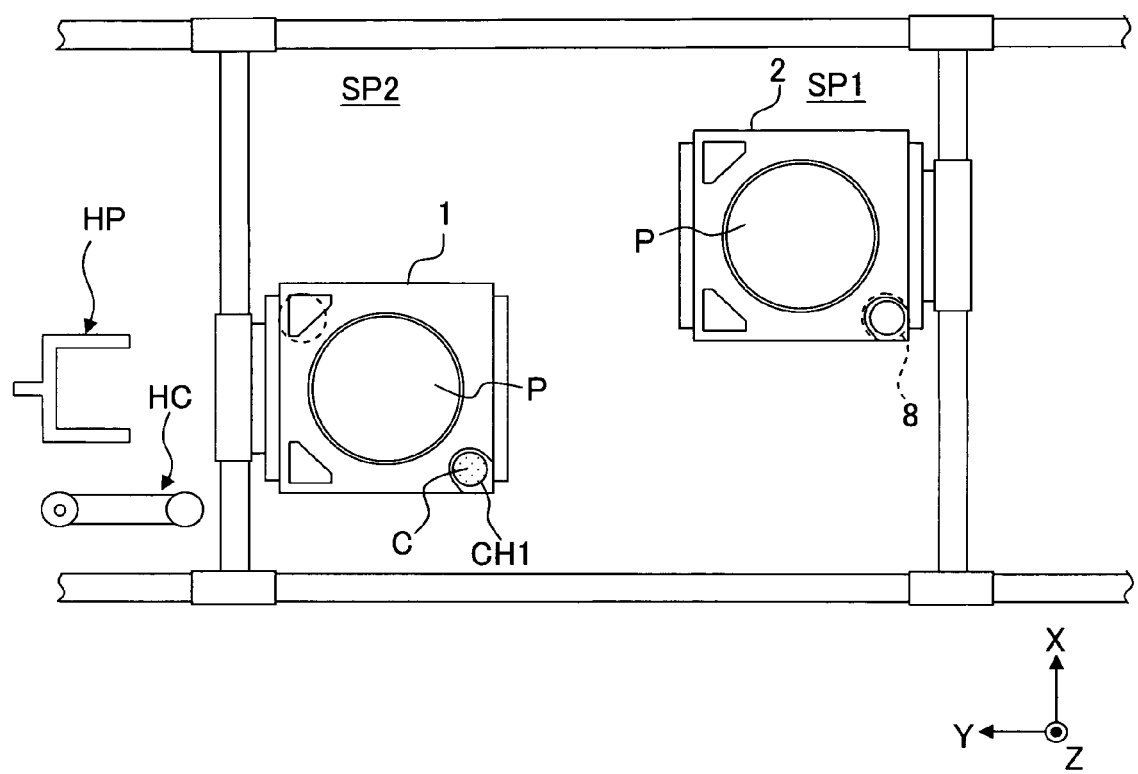
FIG. 18 illustrates the exposure method according to the first embodiment.

Then, as shown in FIG. 18, the controller 7 controls the substrate stage-driving system 5 to move the second substrate stage 2 to the first area SP1 of the exposure station ST1, and to move the first substrate stage 1 to the second area SP2 of the measuring station ST2.

As described above, the cap member transport system HC is arranged in the measuring station ST2. As explained with reference to FIGS. 6 to 8, the cap member C, released from the first cap holder CH1 of the first substrate stage 1 moved to the second area SP2 of the measuring station ST2, is transported to the placing stand HD by the cap member transport system HC.

The placing stand HD is constructed such that an external apparatus can access to the placing stand HD. The external apparatus includes, for example, a transport system which transports the cap member C transported to the placing stand HD to the outside of the exposure apparatus EX, a cleaning system which is capable of cleaning the cap member C, and the like. The cap member C, transported to the placing stand HD by the cap member transport system HC, is processed by the external apparatus. For example, when the external apparatus includes the cleaning system, then the cap member C is transported (exported) to the outside of the exposure apparatus EX, the cap member C is transported to the cleaning system, and then the cap member C is subjected to the cleaning process by the cleaning system. The cleaning system cleans the cap member C, for example, by using a cleaning liquid. Alternatively, the cleaning system may clean the cap member C by using, for example, the so-called ultrasonic cleaning technique in which the cap member C is cleaned by applying the ultrasonic vibration to the cleaning liquid brought into contact with the cap member C. The cap member C, for which the cleaning process has been performed, is placed on the placing stand HD again, and is transported by the cap member transport system HC to the first cap holder CH1 of the first substrate stage 1 present or existing in the second area SP2. The controller 7 transports the cap member C after the cleaning process to the first cap holder CH1 with the cap member transport system HC to hold the cap member C with the first cap holder CH1, and then the controller 7 can execute the ordinary exposure sequence as explained with reference to FIGS. 9 to 14. While performing at least part of the operation including moving the first substrate stage 1 from the first area SP1 to the second area SP2, transporting the cap member C from the first cap holder CH1 to an external device, and cleaning of the cap member C, it is allowable that the second substrate stage 2 on which a new cap member C is held with the second cap holder CH2 is moved to the first area SP1; and that the liquid immersion space LS is formed by the seal member 30 between the first optical element 8 and the opposing surface 25 of the second substrate table 2 (or the substrate P) to perform the exposure for the substrate P on the second substrate stage 2. In this case, prior to the transfer of the cap member C from the first cap holder CH1 to the placing stand HD, a new cap member C is transferred from the placement stand HD to the second cap holder CH2. Alternatively, it is allowable that, in the exchange of the cap member C held by the first cap holder CH1, a new cap member C is transferred from the placing stand HE to the first cap holder CH1, and that the first substrate stage ST1 holding the new cap member C and the substrate P is moved to the first area SP1 to form the liquid immersion space LS by the seal member 30 and to perform the exposure for the substrate P.

Alternatively, in the embodiment described above, the cap member C transported to the placing stand HD may be exported to the outside of the exposure apparatus EX; and after that, the cap member C may be discarded or disused without reusing the transported cap member C, and the discarded cap member C may be exchanged with a new cap member C.

Further alternatively, the placing stand HD may be constructed to be accessible by an operator; the cap member C placed on the placing stand HD may be transported to the outside of the exposure apparatus EX by the operator; and/or the cap member C may be subjected to the cleaning process by the operator.

The controller 7 uses the substrate transport system HP to thereby make it possible to execute the operation for unloading the substrate P, for which the exposure process has been completed in the exposure station ST1, from the substrate holder 13 of the first substrate stage 1 concurrently with at least a part of the operation for transporting the cap member C from the first cap holder CH1 of the first substrate stage 1 to the placing stand HD by using the cap member transport system HC.

It is also possible to execute the unload operation for the substrate P, on the first substrate stage 1, for which the exposure process has been completed in the exposure station ST1, concurrently with at least a part of the exporting (transporting) operation for exporting the cap member C transported to the placing stand HD to the outside of the exposure apparatus EX.

In this case, the explanation has been made as exemplified by the case in which the cap member C, released from the first cap holder CH1 of the first substrate stage 1 moved to the second area SP2 of the measuring station ST2, is transported to the placing stand HD by the cap member transport system HC, and the cap member C, transported from the outside of the exposure apparatus EX to the placing stand HD at the inside of the exposure apparatus EX, is transported to the first cap holder CH1 of the first substrate stage 1 moved to the second area SP2 of the measuring station ST2 by the cap member transport system HC. However, it is a matter of course that the cap member C, released from the second cap holder CH2 of the second substrate stage 2 moved to the second area SP2 of the measuring station ST2, can be also transported to the placing stand HD by the cap member transport system HC, and/or the cap member C, which is transported from the outside of the exposure apparatus EX to the placing stand HD at the inside of the exposure apparatus EX, can be also transported to the second cap holder CH2 of the second substrate stage 2 moved to the second area SP2 of the measuring station ST2 by the cap member transport system HC.

As explained above, the cap member C released from the seal member 30, the first cap holder CH1, and the second cap holder CH2 is transported to the predetermined position which is different from the seal member 30, the first cap holder CH1, and the second cap holder CH2 by using the cap member transport system HC. Therefore, the appropriate process (for example, the cleaning process and/or the exchange process) can be executed for the cap member C transported to the predetermined position in order to suppress the deterioration of the performance of the exposure apparatus EX which would be otherwise caused due to the cap member C.

In this embodiment, the cap member transport system HC is arranged in the measuring station ST2. The cap member C, which is released from the first cap holder CH1 (or the second cap holder CH2) of the first substrate stage 1 (or the second substrate stage 2) moved to the measuring station ST2, is moved to the predetermined position (the placing stand HD in this embodiment). Accordingly, it is possible to smoothly execute the transport operation for transporting the cap member C; and it is possible to concurrently perform, for example, the unload operation for unloading the substrate P, which is held by the substrate holder 13 of the first substrate stage 1 after the exposure process, by the substrate transport system HP and the transport operation for transporting the cap member C, which is held by the first cap holder CH1 of the first substrate stage 1, by the cap member transport system HC.

In this embodiment, the cap member C is transported to the placing stand HD of the measuring station ST2. However, the cap member C may be transported to any position other than the placing stand HD provided that the predetermined process can be executed for the cap member C in order to suppress the deterioration of the performance of the exposure apparatus EX.

The controller 7 judges whether or not the cap member transport system HC is to be driven, namely whether or not the transport operation is to be executed for the cap member C by using the cap member transport system HC. The cap member transport system HC is driven in accordance with an instruction of the controller 7 which judges whether or not the cap member transport system HC is to be driven. Further, the operation for recovering all of the liquid LQ in the liquid immersion space, which is executed prior to the transport operation of the cap member transport system HC, is also executed in accordance with the judgment of the controller 7.

For example, the controller 7 controls the cap member transport system HC based on the predetermined number of the substrates P for which the exposure has been performed or based on the lot information about the substrate P. That is, the controller 7 executes the transport operation for the cap member C using the cap member transport system HC, for example, for every lot or every predetermined number of the substrates P for which the exposure process has been performed. The controller 7 may execute the transport operation for the cap member C using the cap member transport system HC at any periodical predetermined timing, for example, at every predetermined time interval.

If the cap member C is polluted in the state that the cap member C is held by the cap holder CH1 (CH2), there is a possibility that a lot of pattern defects may arise, due to the polluted cap member C, in the vicinity of the cap holder CH1 (CH2) on the surface of the substrate P held by the substrate holder 13 (23). Therefore, when the substrate P after the exposure process is inspected by a defect-inspecting device and when a lot of pattern defects appear in the area of the surface of the substrate P in the vicinity of the cap holder CH1 (CH2) holding the cap member C, then it can be postulated that the cap member C is polluted. Accordingly, the following procedure may be adopted that when the substrate P after the exposure process is inspected by the defect-inspecting device and it is judged based on the inspection result that a lot of pattern defects appear in the area of the surface of the substrate P in the vicinity of the cap holder CH1 (CH2) holding the cap member C, then it is allowable to execute the cleaning process for the cap member C, the exchange process for the cap member C, or the like. In this way, the controller 7 can control the cap member transport system HC based on the information from the inspecting device which inspects the exposed substrate P. For example, when the exposure apparatus EX and the inspection device for inspecting the substrate are connected via a communication line, the controller 7 can control the exchange system CHS based on the information from the inspecting device.

For example, an observing device (for example, a camera), which includes an image pickup device capable of photographing or imaging an image (optical image) of, for example, the cap member C, may be provided and the transport operation for the cap member C by the cap member transport system HC may be controlled based on the image pickup result. Specifically, if it is judged based on the image pickup result of the image pickup device that the cap member C is polluted, then the cleaning process, the exchange process or the like is executed for the cap member C. The observing device can be arranged at a position, on the placing stand HD, at which the observing device can observe the cap member C transported by the cap member transport system HC. If the controller 7 judges that the cap member C is polluted based on the information from the observing device observing the transported cap member C, then the controller 7 can execute the cleaning process, the exchange process or the like for the cap member C. On the other hand, if the controller 7 judges that the cap member C is not polluted, then the controller 7 can return the cap member C to the first cap holder CH1 or the second cap holder CH2 to execute the ordinary exposure sequence.

Second Embodiment

Next, a second embodiment will be explained. In the following description, the constitutive components or parts, which are same as or equivalent to those of the first embodiment described above, are designated by the same reference numerals, and any explanation therefor will be simplified or omitted.

Figure 19:
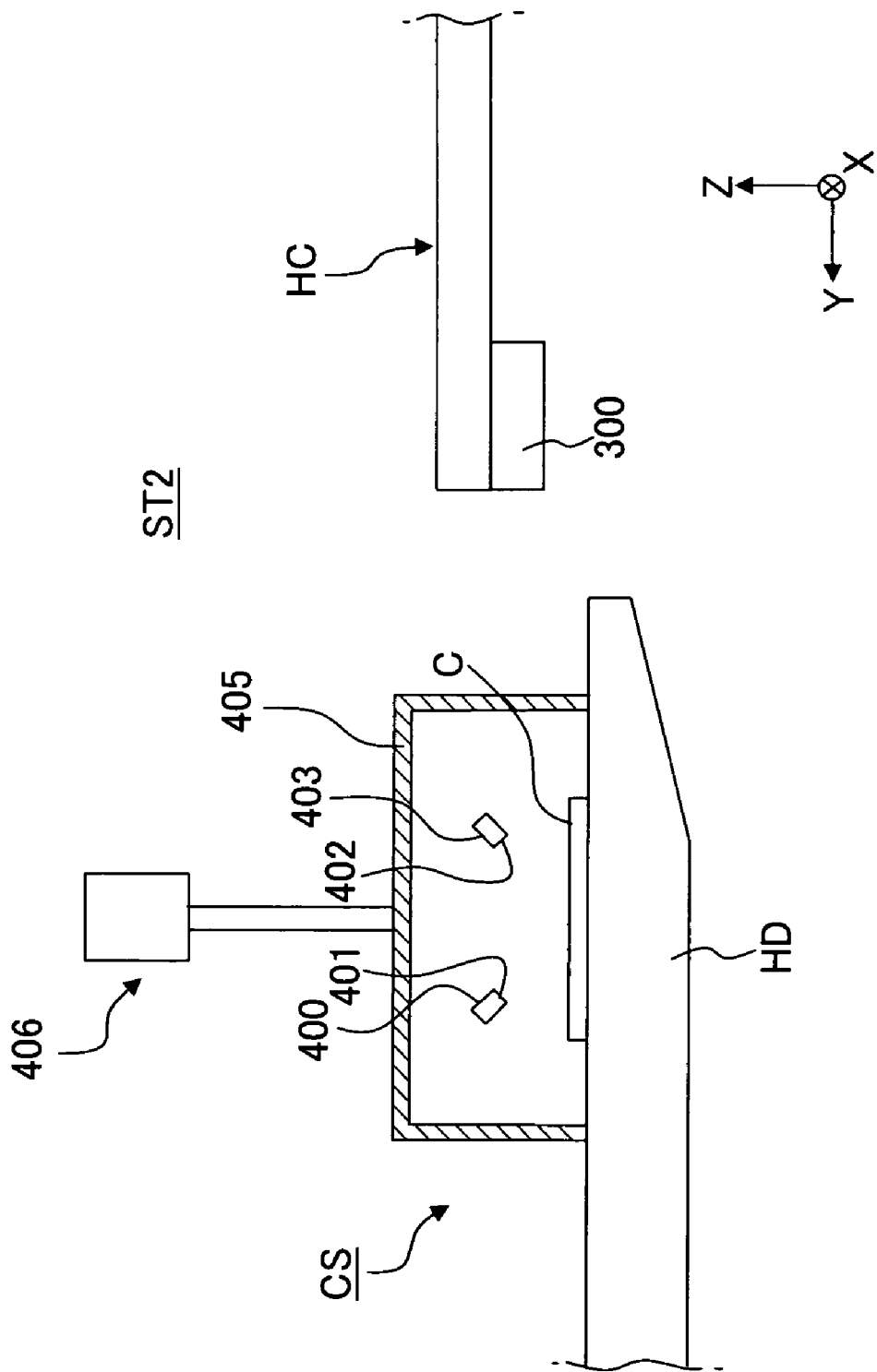
FIG. 19 shows a part of an exposure apparatus according to a second embodiment.

FIG. 19 shows a part of an exposure apparatus EX according to the second embodiment. The feature of the second embodiment is that the exposure apparatus EX is provided with a cleaning system CS which cleans the cap member C.

As shown in FIG. 19, the exposure apparatus EX is provided with the cleaning system CS which cleans the cap member C. The cleaning system CS is arranged at a predetermined position different from the seal member 30, the first cap holder CH1, and the second cap holder CH2. The cleaning system CS is capable of performing the cleaning process for the cap member C transported to the predetermined position. The cleaning system CS cleans the cap member C released from the seal member 30, the first cap holder CH1, and the second cap holder CH2.

In this embodiment, the cleaning system CS is arranged in the vicinity of the placing stand HD of the measuring station ST2. The cleaning system CS cleans the cap member C released from the seal member 30, the first cap holder CH1, and the second cap holder CH2. In this embodiment, the cap member transport system HC can transport the cap member C, released from the seal member 30, the first cap holder CH1, and the second cap holder CH2, to the cleaning system CS arranged on the placing stand HD.

In this embodiment, the cleaning system CS performs the cleaning process by using a cleaning liquid. The cleaning system CS includes a supply nozzle 400 which has a supply port 401 for supplying the cleaning liquid to the cap member C, and a recovery nozzle 403 which has a recovery port 402 for recovering the cleaning liquid supplied to the cap member C. The cleaning system CS further includes a chamber mechanism 405 which accommodates the cap member C to be subjected to the cleaning, and a driving device 406 which moves the chamber mechanism 405. When the controller 7 makes the cap member C to be transported to the placing stand HD by using the cap member transport system HC, the controller 7 controls the driving device 406 to move the chamber mechanism 405 in the +Z direction and to move the chamber mechanism 405 away from the placing stand HD so that the cap member transport system HC can transport the cap member C to the placing stand HD. When the controller 7 makes the cap member C to be cleaned by using the cleaning system CS, the controller 7 controls the driving device 406 to move the chamber mechanism 405 in the −Z direction and to move the chamber mechanism 405 closer to the placing stand HD so that the chamber mechanism 405 forms a space for accommodating the cap member C between the chamber mechanism 405 and the placing stand HD.

Next, an explanation will be made about an example of the operation of the cleaning system CS. In order to clean the cap member C by using the cleaning system CS, the controller 7 uses the cap member transport system HC to transport, to the placing stand HD, the cap member C, which is released from the seal member 30, the first cap holder CH1, and the second cap holder CH2. In relation to the first embodiment, for example, as explained in relation to FIG. 18, the cleaning is performed after the liquid immersion exposure step for exposing the substrate on the first substrate stage 1, the step for recovering the liquid, the step for moving the first substrate stage 1 holding the cap member C to the second area SP2 of the measuring station ST2, and the step for transporting the cap member C from the first cap holder CH1 to the placing stand HD by the transport system HC. As described above, upon transporting the cap member C to the placing stand HD, the controller 7 moves the chamber mechanism 405 away from the placing stand HD. After placing the cap member C on the placing stand HD with the cap member transport system HC, the controller 7 moves the chamber mechanism 405 closer to the placing stand HD to form the space between the chamber mechanism 405 and the placing stand HD for accommodating the cap member C therein.

The supply nozzle 400 and the recovery nozzle 403 are arranged inside the space formed between the chamber mechanism 405 and the placing stand HD. The controller 7 supplies the cleaning liquid from the supply port 401 to the cap member C to clean the cap member C. Accordingly, the cap member C is cleaned. The cleaning liquid supplied from the supply port 401 is recovered from the recovery port 402. Each of the chamber mechanism 405, the placing stand HD, and the boundary portion therebetween is sealed so that the cleaning liquid does not leak, namely the space formed between the chamber mechanism 405 and the placing stand HD is a tightly closed space.

After completing the cleaning operation with the cleaning system CS, the controller 7 moves the chamber mechanism 405 away from the placing stand HD, and transports the cleaned cap member C with the cap member transport system HC to the first cap holder CH1 (or the second cap holder CH2) of the first substrate stage 1 (or the second substrate stage 2) arranged in the second area SP2. After that, the ordinary exposure sequence is started. That is, the liquid immersion exposure and the measurement process are performed as explained in relation to FIGS. 9 to 14 in the first embodiment.

The cleaning system CS may clean the cap member C by using, for example, the so-called ultrasonic cleaning technique in which the cap member C is cleaned by applying the ultrasonic vibration to the cleaning liquid brought into contact with the cap member C. In this case, the cleaning system CS includes an ultrasonic washer or cleaner provided with an ultrasonic generator which applies the ultrasonic vibration to the cleaning liquid brought into contact with the cap member C.

As explained above, the exposure apparatus EX can be provided with the cleaning system CS for cleaning the cap member C. When the cap member C is cleaned by using the cleaning system CS provided for the exposure apparatus EX, it is possible to suppress the deterioration of the performance of the exposure apparatus EX which would be otherwise caused, for example, due to the pollution of the cap member C.

The second embodiment has been explained as exemplified by the case in which the exposure apparatus EX is an exposure apparatus of the multi-stage type (twin-stage type) provided with the plurality of (two) substrate stages 1, 2. However, it is a matter of course that the present invention is also appropriately applicable to any exposure apparatus EX having one substrate stage. The cleaning system CS for cleaning the cap member C can be also provided for such an exposure apparatus. In a similar manner, it is allowable that the exposure apparatus EX of the first embodiment has one substrate stage instead of having a plurality of substrate stages.

First Modification

Each of the above-described first and second embodiments is constructed, as explained in relation to FIGS. 15 and 16, so that all of the liquid LQ in the liquid immersion space LS is recovered after the completion of the liquid immersion exposure for the substrate P on the first substrate table 12. However, the cap member C may be removed from the first cap holder CH1 of the first substrate table 12, and the cap member C may be replaced or cleaned (washed) during the period in which the liquid immersion exposure is performed for the substrate P on the first substrate table 12 or during the period in which the liquid immersion space LS is retained between the first optical element 8 and any portion (for example, the opposing surface 15) different from than the cap member C on the first substrate table 12. In order to execute the operation as described above, for example, the cap member transport system HC and the placing stand HD can be arranged in the exposure station ST1, rather than being arranged in the measuring station ST2. In this case, the cap member transport system HC removes the cap member C from the first cap holder CH1 and transports the cap member C to the placing stand HD during the period in which the liquid immersion space LS of the liquid LQ is retained between the first optical element 8 and the opposing surface 15 of the substrate table 12. By exchanging or cleaning the cap member C when the liquid LQ supplied to the liquid immersion space LS is retained between the first optical element 8 and any member different from the cap member C, the liquid recovery operation can be omitted as unnecessary, and the period of time required for performing the operation for exchanging (or cleaning) the cap member C can be shortened. Therefore, it is possible to improve the throughput of the substrate exposure. Further, the liquid LQ is not released (separated, disengaged) from the first optical element 8, namely the liquid LQ is always maintained between the first optical element 8 and the member different from the first optical element 8 even during the step of exchanging or cleaning the cap member C. Therefore, it is possible to avoid the appearance of the water mark on the first optical element 8, on the portion which makes contact with the liquid, and the like. Note that when the first substrate stage 1 holding the cap member C is exchanged for an object, it is allowable to arrange the object to face the first optical element 8 and to maintain the liquid immersion space LS of the liquid LQ between the object and the first optical element 8. In this case also, a similar effect as described above can be obtained.

Second Modification

Figure 20:
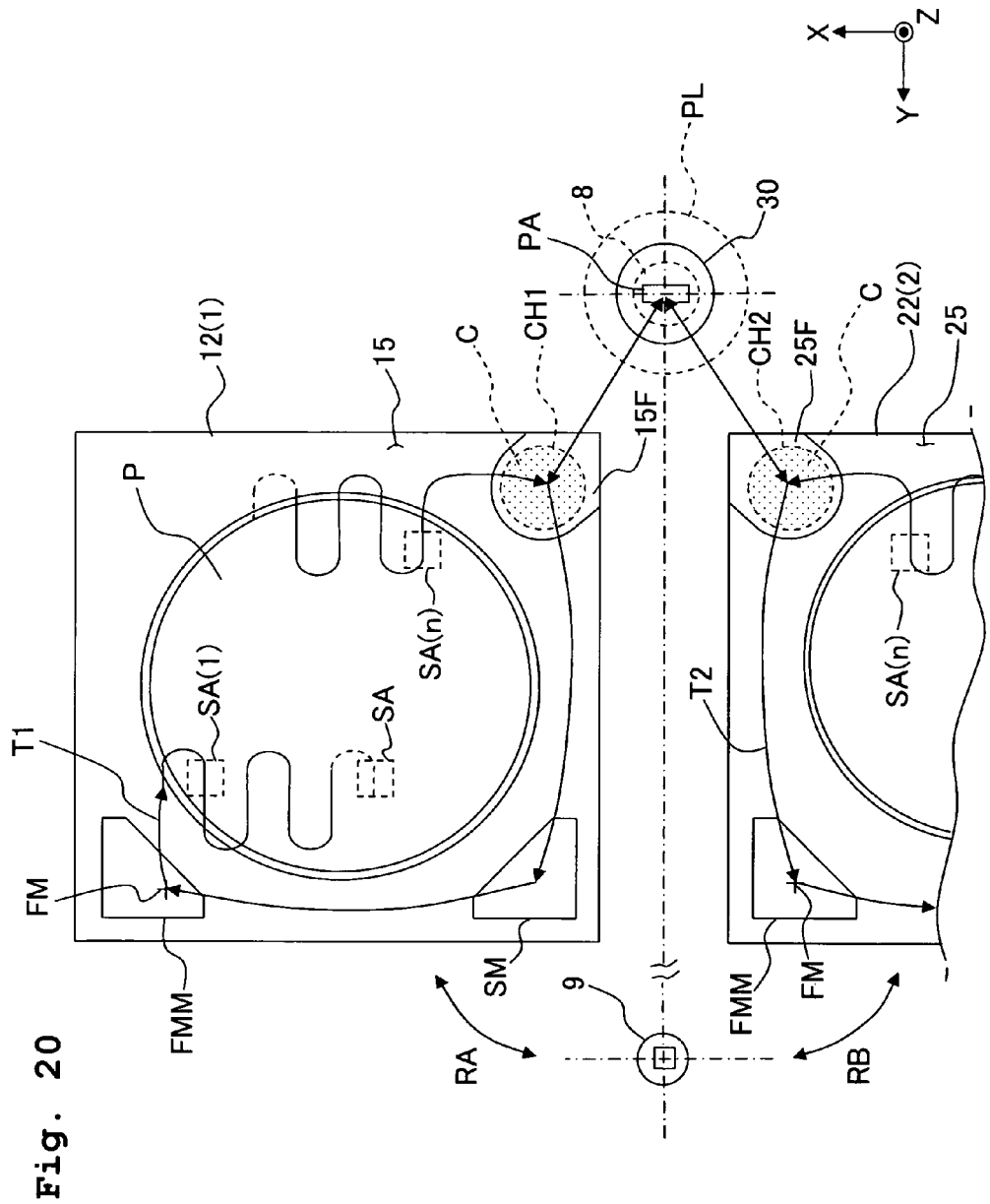
FIG. 20 shows a second modification of the exposure apparatus.

In the first and second embodiments described above, the first cap holder CH1 and the second cap holder CH2 are provided at the approximately identical positions on the first and second substrate tables 12, 22 respectively. However, as shown in FIG. 20, the first cap holder CH1 and the second cap holder CH2 may be provided at different positions. In the example shown in FIG. 20, the first cap holder CH1 is arranged at a corner on the −X side and on the −Y side among the four corners of the first substrate table 12; and the second cap holder CH2 is arranged at a corner on the +X side and on the −Y side among the four corners of the second substrate table 22. Upon moving each of the first substrate stage 1 and the second substrate stage 2 between the first area SP1 and the second area SP2 in the exposure apparatus EX shown in FIG. 20, the controller 7 controls the substrate stage-driving system 5 so that the first substrate stage 1 always passes across an area on the +X side of the third area SP3 (see an arrow RA shown in FIG. 20), and that the second substrate stage 2 always passes across an area on the −X side of the third area SP3 (see an arrow RB shown in FIG. 20). By doing so, it is possible to shorten the distance between the seal member 30 and the first cap holder CH1 on the first substrate stage 1 existing in the third area SP3 and the distance between the seal member 30 and the second cap holder CH2 on the second substrate stage 2 existing in the third area SP3. Therefore, it is possible to quickly perform each of the operation for delivering the cap member C held by the seal member 30 to the first cap holder CH1 and the operation for delivering the cap member C held by the seal member 30 to the second cap holder CH2.

The shot areas SA of the substrates P, which are placed on the first substrate table 12 and the second substrate table 22 respectively as shown in FIG. 20, are subjected to the liquid immersion exposure in accordance with the step-and-scan manner as described above. In the exposure performed in the step-and-scan manner, the exposure is executed such that for each of the shot areas SA, the substrate P is moved in the scanning direction (in the +Y direction or in the −Y direction in the drawing) relative to an exposure area PA in which the exposure light EL is irradiated in the image field of the projection optical system PL (namely, a projection area of the mask pattern). Further, when the exposure is completed for one shot area SA among the shot areas SA, the substrate P is step-moved in a direction perpendicular to the scanning direction (in the +X direction or in the −X direction shown in the drawing) so that a next shot area SA is positioned at the exposure start position. Such movement loci of the projection area PA on the substrate P are shown as T1 and T2 in FIG. 20 respectively. In each of these embodiments, although the first and second substrate tables 12, 22 are actually moved, the relative movement of the projection area PA with respect to the substrate stages is depicted as the movement loci T1, T2 for the convenience of the explanation.

As shown in FIG. 20, when the first cap holder CH1 of the first substrate table 12 receives the cap member C which maintains (retains) the liquid immersion area LS, then the projection area PA (as well as the liquid immersion area LS) is moved along the movement locus T1 by the movement of the first substrate table 12. On the first substrate table 12, the projection area PA (as well as the liquid immersion area LS) arrives, via the measuring member SM and the reference member FMM, to an exposure start position for a shot area SA(1) which is first to be exposed on the substrate P. Note that during this movement, the above-described measurement process is performed using the measuring member SM and the reference member FMM. Then, the step-and-scan exposure is performed along the movement locus T1. Here, a shot area SA(n) is a shot area which is to be exposed last on the substrate P, and is located at a position closest to the first cap holder CH1. Therefore, the liquid immersion area LS is quickly moved from the substrate P onto the cap member C after the completion of the exposure. On the other hand, on the second substrate table 22, as shown in FIG. 20, the projection area PA (and the liquid immersion area LS) moves along the movement locus T2. Namely, the projection area PA (and the liquid immersion area LS) moves onto the substrate P via the cap member on the second cap holder CH2, the reference member FMM and the measuring member SM (not shown in FIG. 20), and the step-and-scan exposure is performed. Since the shot area SA(n) located at a position closest to the second cap holder CH2 is exposed last, the liquid immersion area LS is quickly moved from the substrate P onto the cap member C after the completion of the exposure. Note that as apparent from the movement loci T1 and T2 in FIG. 20, the order of exposure for the shot areas in substrate P is different between the first and second substrate tables 12 and 22.

In the example shown in FIG. 20, areas 15F, 25F, which are lower than the upper surface of the cap member C, are formed around the cap member C held by the first and second cap holders CH1, CH2 of the first and second substrate tables 12, 22. In other words, parts of the opposing surfaces 15, 25, which are around the first and second cap holders CH1, CH2 capable of holding the cap member C, are cut out. Accordingly, it is possible to smoothly perform the operation for delivering the cap member C between the seal member 30 and the first cap holder CH1 and the operation for delivering the cap member C between the seal member 30 and the second cap holder CH2.

In the respective embodiments described above, a cleaned cap member C is provided on the substrate stage and to be used. However, it is allowable, for example, that any cleaning is not performed for the collected (removed) cap member C; and that a new cap member C is merely provided on the substrate stage in the exchange with respect to the collected (used) cap member C. In this case, the collected cap member C collected from the placing stand HD may be transported (unloaded) by, for example, an unillustrated transport system to a container in the exposure apparatus or to the outside of the exposure apparatus; and an unused cap member C may be transported (loaded) from the container in the exposure apparatus or from the outside of the exposure apparatus. In each of the embodiments, although the above-described observing device is used to observe the cap member C for judging whether or not the cap member C needs to be cleaned or exchanged, it is allowable to use a sensor of the exposure apparatus, such as the alignment system AL, as the observing device.

In the respective embodiments described above, the optical path space, on the side of the image plane (light exit surface) of the first optical element at the end portion of the projection optical system PL, is filled with the liquid LQ. However, it is also allowable that the optical path space, on the side of an object plane (light incident surface) of the first optical element at the end portion, is also filled with the liquid, as disclosed, for example, in International Application Publication No. 2004/019128 (corresponding to United States Patent Application Publication No. 2005/0248856). Further, a thin film, which has a liquid-attractive property and/or an anti-dissolution function, may be formed on all or a part (including at least the contact surface with respect to the liquid) of the surface of the terminal end optical element 8. The silica glass has a high affinity for the liquid, and thus any anti-dissolution film is unnecessary therefor. However, it is preferable to form at least the anti-dissolution film for the calcium fluoride.

The liquid LQ is water in the embodiments of the present invention. However, the liquid LQ may be any liquid other than water. For example, when the light source of the exposure light EL is the $F_2$ laser, the $F_2$ laser beam is not transmitted through water. Therefore, it is allowable to use, as the liquid LQ, fluorine-based fluids such as fluorine-based oil, perfluoropolyether (PFPE), etc. Alternatively, other than the above, it is also possible to use, as the liquid LQ, liquids (for example, cedar oil) which have the transmittance with respect to the exposure light EL, which have a refractive index as high as possible, and which are stable against the photoresist forming the surface of the substrate P and the projection optical system PL. It is also allowable to use, as the liquid LQ, liquids having the refractive index of about 1.6 to 1.8. The liquid LQ, which has the refractive index higher than that of pure or purified water (for example, not less than 1.5), includes, for example, predetermined liquids having the C—H bond or the O—H bond such as isopropanol having a refractive index of about 1.50 and glycerol (glycerin) having a refractive index of about 1.61, predetermined liquids (organic solvents) such as hexane, heptane, and decane, and decalin (decahydronaphthalene) having a refractive index of about 1.60. As for the liquid LQ, it is also allowable to use liquids obtained by mixing arbitrary two or more of the foregoing liquids and liquids obtained by adding (mixing) at least one of the foregoing liquid or liquids to (with) pure water. Further, as for the liquid LQ, it is also allowable to use liquids obtained by adding (mixing) base or acid such as $H^+$, $Cs^+$, $K^+$, $Cl^-$, $SO_4^{2-}$, and $PO_4^{2-}$ to (with) pure water, and it is also allowable to use liquids obtained by adding (mixing) fine particles of Al oxide or the like to (with) pure water. As for the liquid LQ, it is preferable to use liquids which have a small coefficient of light absorption, which have a small temperature dependency, and which are stable against the photosensitive material (or, for example, the top coat film or the antireflection film) coated on the surface of the substrate P and/or the projection system PL. As for the liquid LQ, it is also possible to use various fluids including, for example, supercritical fluids.

In the respective embodiments described above, the measuring system including the laser interferometer (interferometer system) is used to measure the position information about each of the mask stage and the substrate stage. However, the measurement of positional information is not limited to this. For example, it is also allowable to use an encoder system which detects a scale (diffraction grating) provided for each of the stages as disclosed, for example, in International Publication No. 2007/083758 (corresponding to U.S. patent application Ser. No. 11/655,082) and International Publication No. 2007/097379 (corresponding to U.S. patent application Ser. No. 11/708,533). Alternatively, it is also allowable to use an encoder system in which an encoder head is provided for a substrate table, and a scale is arranged over or above the substrate table as disclosed, for example, in United States Patent Application Publication No. 2006/0227309. In this case, it is preferable that a hybrid system including both of the interferometer system and the encoder system is provided, and the measurement result of the encoder system is calibrated (subjected to the calibration) by using the measurement result of the interferometer system. The position control of the stage may be performed by switchingly using the interferometer system and the encoder system or by using both of them. Further alternatively, in the respective embodiments described above, it is also allowable to use a plane motor as the actuator for driving each of the first and second substrate stages.

The substrate P, which is usable in the respective embodiments described above, is not limited to the semiconductor wafer for producing a semiconductor device. Substrates applicable include, for example, a glass substrate for a display device, a ceramic wafer for a thin film magnetic head, a mask used for an exposure apparatus, a master plate (synthetic silica glass, silicon wafer) for the mask or the reticle to be used for the exposure apparatus, a film member, and the like. Further, the shape of the substrate P is not limited to the circular shape, and may be any other shape including, for example, rectangular shapes.

As for the exposure apparatus EX, the present invention is also applicable to a scanning type exposure apparatus (scanning stepper) based on the step-and-scan manner for performing the scanning exposure for the substrate P with the image of the pattern of the mask M while moving the substrate P in synchronization with the movement of the mask M as well as to a projection exposure apparatus (stepper) based on the step-and-repeat system for performing the full field exposure with the image of the pattern of the mask M in a state that the mask M and the substrate P are allowed to stand still, while successively step-moving the substrate P.

Further, in the exposure based on the step-and-repeat system, a reduction image of a first pattern may be projected onto the substrate P by using the projection optical system in a state that the first pattern and the substrate P are allowed to substantially stand still, and then the full field projection may be performed on the substrate P by partially overlaying a reduction image of a second pattern with respect to the first pattern by using the projection optical system in a state that the second pattern and the substrate P are allowed to substantially stand still (i.e., for example, the full field exposure apparatus based on the stitch system may be the exposure apparatus EX). As for the exposure apparatus based on the stitch system, the present invention is also applicable to an exposure apparatus based on the step-and-stitch system in which at least two patterns are partially overlaid and transferred on the substrate P, and the substrate P is successively moved. The exposure apparatus based on the stitch system may be a scanning type exposure apparatus in which respective patterns are transferred by the scanning exposure.

Further, the present invention is also applicable to an exposure apparatus including a substrate stage which holds the substrate and a measuring stage which is provided with a reference member having a reference mark formed therein and/or various types of photoelectric sensors as disclosed, for example, in Japanese Patent Application Laid-open No. 11-135400 (corresponding to International Publication No. 1999/23692) and Japanese Patent Application Laid-open No. 2000-164504 (corresponding to U.S. Pat. No. 6,897,963). Contents of U.S. Pat. No. 6,897,963 and the like are incorporated herein by reference. It is possible to suppress the deterioration of the performance of such an exposure apparatus EX by providing, for example, the cleaning system CS as described above for the exposure apparatus EX.

The respective embodiments described above have been explained as exemplified by the exposure apparatus provided with the projection optical system PL. However, the present invention is applicable to an exposure apparatus and an exposure method in which the projection optical system PL is not used. Even in such a case that the projection optical system PL is not used, the exposure light is radiated onto the substrate via an optical member such as a lens, and the liquid immersion space is formed in a predetermined space between such an optical member and the substrate. Further, the mask stage can be also omitted depending on the exposure system as described above.

The optical element (terminal end optical element) 8 of the projection optical system PL may be formed of, for example, a single crystal material of fluorine compound such as barium fluoride, strontium fluoride, lithium fluoride, and sodium fluoride, or silica glass (silica), instead of calcium fluoride. Alternatively, the optical element (terminal end optical element) 8 may be formed of a material having a refractive index higher than those of silica glass and calcium fluoride (for example, a material having a refractive index of not less than 1.6). Materials usable as the material having the refractive index of not less than 1.6 include, for example, sapphire and germanium dioxide disclosed in International Publication No. 2005/059617 and potassium chloride (refractive index: about 1.75) disclosed in International Publication No. 2005/059618.

In the respective embodiments described above, the ArF excimer laser is used as the light source for the exposure light EL. However, it is also allowable to use a high harmonic wave-generating device which includes a solid laser light source such as a DFB semiconductor laser or a fiber laser, a light-amplifying device having a fiber amplifier or the like, a wavelength-converting device and the like, and which outputs a pulse light beam having a wavelength of 193 nm as disclosed, for example, in U.S. Pat. No. 7,023,610. Further, in the respective embodiments described above, although the projection area (exposure area) is rectangular, it is also allowable to adopt any other shape including circular arc-shaped, trapezoidal, parallelogramic, rhombic shapes and the like.

As for the type of the exposure apparatus EX, the present invention is not limited to the exposure apparatus for the semiconductor device production which exposes the substrate P with the semiconductor device pattern. The present invention is also widely applicable, for example, to an exposure apparatus for producing the liquid crystal display device or for producing the display as well as an exposure apparatus for producing, for example, a thin film magnetic head, an image pickup device (CCD), a micromachine, MEMS, a DNA chip, a reticle, or a mask.

In the embodiments described above, the light-transmissive type mask is used, in which the predetermined light-shielding pattern (or phase pattern, or dimming or light-reducing pattern) is formed on the light-transmissive substrate. However, instead of such a mask, as disclosed, for example, in U.S. Pat. No. 6,778,257, it is also allowable to use an electronic mask on which a transmissive pattern, a reflective pattern, or a light-emitting pattern is formed based on the electronic data of the pattern to be subjected to the exposure (also referred to as "variable shaped mask", "active mask", or "image generator" including, for example, DMD (Digital micro-mirror Device) as one of the non-light emission type image display device (spatial optical modulator)). An exposure apparatus using DMD is disclosed, for example, in Japanese Patent Application Laid-open Nos. 8-313842 and 2004-304135 in addition to in U.S. Pat. No. 6,778,257 mentioned above. Contents of U.S. Pat. No. 6,778,257 are incorporated herein by reference.

The present invention is also applicable to an exposure apparatus (lithography system) in which the substrate P is exposed with a line-and-space pattern by forming interference fringes on the substrate P as disclosed, for example, in International Publication No. 2001/035168.

Further, the present invention is also applicable, for example, to an exposure apparatus in which patterns of two masks are combined on the substrate via the projection optical system, and one of the shot areas on the substrate is subjected to the double exposure substantially simultaneously by one time of the scanning exposure as disclosed, for example, in Published Japanese Translation of PCT International Publication for Patent Application No. 2004-519850 (corresponding to U.S. Pat. No. 6,611,316). Contents of U.S. Pat. No. 6,611,316 are incorporated herein by reference. Further, the present invention is also applicable, for example, to an exposure apparatus based on the proximity system, a mirror projection aligner, and the like.

As described above, the exposure apparatus EX according to each of the embodiments of the present invention is produced by assembling the various subsystems including the respective constitutive elements as defined in claims so that the predetermined mechanical accuracy, electric accuracy, and optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include the mechanical connection, the wiring connection of the electric circuits, the piping connection of the air pressure circuits, and the like in correlation with the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. It is desirable that the exposure apparatus is produced in a clean room in which the temperature, the cleanness and the like are managed.

Figure 21:
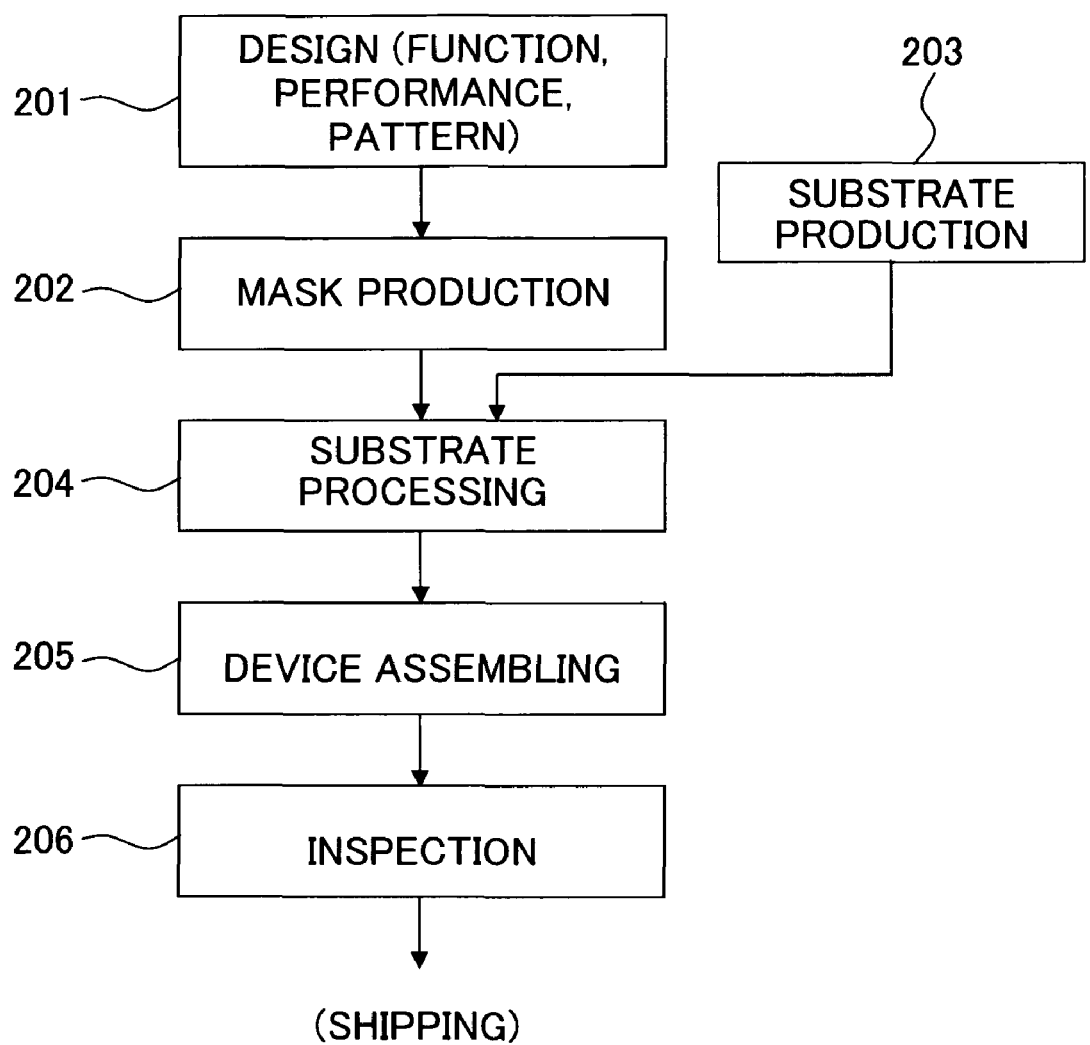
FIG. 21 shows a flow chart illustrating exemplary steps of producing a microdevice.

As shown in FIG. 21, the microdevice such as the semiconductor device is produced by performing, for example, a step 201 of designing the function and the performance of the microdevice, a step 202 of manufacturing a mask (reticle) based on the designing step, a step 203 of producing a substrate as a base material for the device, a substrate processing step 204 including the substrate processing (exposure process) for exposing the substrate with the pattern of the mask and developing the exposed substrate in accordance with the embodiment as described above, a step 205 of assembling the device (including processing processes such as a dicing step, a bonding step, a packaging step and the like), an inspection step 206, and the like.

As for various United States patents and United States patent application Publications etc. referred to in this specification, the contents of the United States patents and United States patent application Publications etc. are incorporated herein by reference, in relation to those other than those having been specifically and explicitly incorporated herein by reference as well.

According to the present invention, the substrate can be exposed efficiently and satisfactorily; and even when the present invention is applied to the liquid immersion exposure, it is possible to produce a device having a desired performance at a good productivity. Therefore, the present invention can remarkably contribute to the development of the precision mechanical equipment industry including the semiconductor industry in our country.

What is claimed is:

1. A liquid immersion exposure apparatus which exposes a substrate by radiating an exposure beam onto the substrate, the liquid immersion exposure apparatus comprising:
    a first optical member having an exit surface via which the exposure beam exits;
    a first movable body which is movable with respect to the first optical member while holding the substrate;
    a second movable body which is movable, while holding the substrate, with respect to the first optical member independently from the first movable body;
    a cover member which is movable in accordance with movement of the first movable body or movement of the second movable body and which is capable of retaining a liquid in a space formed between the exit surface and the cover member when the cover member is located at a position opposite to the exit surface;
    a first holding portion which is provided on the first movable body and which holds the cover member during exposure for a substrate held by the first movable body;
    a second holding portion which is provided on the second movable body and which holds the cover member during exposure for a substrate held by the second movable body; and
    a transport section which removes the cover member from the first holding portion or the second holding portion and which moves the cover member independently from the first movable body or the second movable body, wherein the transport section has a holding portion which holds the cover member and a driving portion which moves the holding portion, the transport section transfers a new cover member to the first holding portion or the second holding portion before or after the transport section removes the cover member from the first holding portion or the second holding portion.

2. The liquid immersion exposure apparatus according to claim 1, further comprising a cleaning section which cleans the cover member.

3. The liquid immersion exposure apparatus according to claim 2, wherein the transport section transports the cover member to the cleaning section.

4. The liquid immersion exposure apparatus according to claim 2, wherein the cleaning section has a supply nozzle via which a cleaning liquid is supplied, and a recovery nozzle via which the supplied cleaning liquid is recovered.

5. The liquid immersion exposure apparatus according to claim 2, wherein the cleaning section includes an ultrasonic cleaning device.

6. The liquid immersion exposure apparatus according to claim 1, further comprising:
    an exposure station including an area in which the first optical member is arranged; and
    a measuring station including an area in which a second optical member is arranged, the second optical member obtaining position information about the substrate,
    wherein the transport section is arranged in the measuring station.

7. The liquid immersion exposure apparatus according to claim 1, wherein the transport section further has a support portion which supports the holding portion and which is moved by the driving portion.

8. The liquid immersion exposure apparatus according to claim 1, further comprising a judging section which performs judgment whether or not the transport section is to be driven.

9. The liquid immersion exposure apparatus according to claim 8, wherein the judging section performs the judgment based on a predetermined number of the substrate for which the exposure has been performed or lot information about the substrate.

10. The liquid immersion exposure apparatus according to claim 8, wherein the judging section performs the judgment based on information from an inspecting device which inspects the exposed substrate.

11. The liquid immersion exposure apparatus according to claim 8, wherein the judging section performs the judgment based on information from an observing device which observes the transported cover member.

12. The liquid immersion exposure apparatus according to claim 1, wherein a surface, of the cover member, which is opposite to the exit surface is liquid-repellent.

13. A method for producing a device, comprising:
    exposing a substrate by using the liquid immersion exposure apparatus as defined in claim 1;
    developing the exposed substrate; and
    processing the developed substrate.

* * * * *